United States Patent
Garrett, Jr.

(10) Patent No.: US 9,257,161 B2
(45) Date of Patent: Feb. 9, 2016

(54) MECHANISM FOR ENABLING FULL DATA BUS UTILIZATION WITHOUT INCREASING DATA GRANULARITY

(71) Applicant: Rambus Inc., Sunnyvale, CA (US)

(72) Inventor: Billy Garrett, Jr., N. Charleston, SC (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/476,334

(22) Filed: Sep. 3, 2014

(65) Prior Publication Data

US 2015/0039822 A1    Feb. 5, 2015

Related U.S. Application Data

(60) Continuation of application No. 13/720,585, filed on Dec. 19, 2012, now Pat. No. 8,856,480, which is a continuation of application No. 12/393,265, filed on Feb. 26, 2009, now Pat. No. 8,370,596, which is a division of application No. 09/837,307, filed on Apr. 17, 2001, now Pat. No. 7,500,075.

(51) Int. Cl.
*G06F 12/00* (2006.01)
*G11C 7/10* (2006.01)
*G06F 3/06* (2006.01)

(52) U.S. Cl.
CPC .......... *G11C 7/1072* (2013.01); *G06F 3/0619* (2013.01); *G06F 3/0665* (2013.01); *G06F 3/0689* (2013.01); *G11C 7/1042* (2013.01)

(58) Field of Classification Search
CPC .................................. G06F 12/00; G06F 3/06

USPC .............................. 711/5, 100, 154, 167–170
See application file for complete search history.

(56) References Cited

U.S. PATENT DOCUMENTS

| | | | |
|---|---|---|---|
| 4,377,855 A | 3/1983 | Lavi | |
| 4,542,483 A | 9/1985 | Procyk | |
| 4,569,036 A | 2/1986 | Fujii | |
| 4,636,982 A | 1/1987 | Takemae | |
| 4,646,268 A | 2/1987 | Kuno | |
| 4,654,819 A * | 3/1987 | Stiffler | ................ G06F 11/1435 711/162 |
| 4,698,788 A | 10/1987 | Flannagan | |
| 4,700,328 A | 10/1987 | Burghard | |

(Continued)

FOREIGN PATENT DOCUMENTS

EP    1248267 A2    10/2002
WO    WO-91-16680 A1    10/1991

OTHER PUBLICATIONS

Aimoto et al., "SP23.3 A 7168GIPS 3.84GB/s 1W Parallel Image-Processing RAM Integrating a 16Mb DRAM and 128 Processors," ISSCC, Feb. 1996, pp. 372-373/476. 3 pages.

(Continued)

*Primary Examiner* — Tuan Thai

(57) ABSTRACT

A memory is disclosed comprising a first memory portion, a second memory portion, and an interface, wherein the memory portions are electrically isolated from each other and the interface is capable of receiving a row command and a column command in the time it takes to cycle the memory once. By interleaving access requests (comprising row commands and column commands) to the different portions of the memory, and by properly timing these access requests, it is possible to achieve full data bus utilization in the memory without increasing data granularity.

19 Claims, 12 Drawing Sheets

(56) References Cited

U.S. PATENT DOCUMENTS

| | | | |
|---|---|---|---|
| 4,710,902 A | 12/1987 | Pelley | |
| 4,740,921 A | 4/1988 | Lewandowski | |
| 4,758,993 A | 7/1988 | Takemae | |
| 4,787,858 A | 11/1988 | Killian, Jr. | |
| 4,796,230 A | 1/1989 | Young | |
| 4,800,525 A | 1/1989 | Shah | |
| 4,811,302 A | 3/1989 | Koishi | |
| 4,825,413 A | 4/1989 | Tran | |
| 4,837,743 A | 6/1989 | Chiu | |
| 4,839,796 A | 6/1989 | Rorden | |
| 4,843,264 A | 6/1989 | Galbraith | |
| 4,862,421 A | 8/1989 | Tran | |
| 4,888,732 A | 12/1989 | Inoue | |
| 4,903,344 A | 2/1990 | Inoue | |
| 4,961,168 A | 10/1990 | Tran | |
| 4,982,370 A | 1/1991 | Matsumoto | |
| 4,984,196 A | 1/1991 | Tran | |
| 4,991,141 A | 2/1991 | Tran | |
| 5,046,050 A | 9/1991 | Kertis | |
| 5,093,806 A | 3/1992 | Tran | |
| 5,111,434 A | 5/1992 | Cho | |
| 5,119,340 A | 6/1992 | Slemmer | |
| 5,121,358 A | 6/1992 | Slemmer | |
| 5,124,610 A | 6/1992 | Conley | |
| 5,124,951 A | 6/1992 | Slemmer | |
| 5,128,897 A | 7/1992 | McClure | |
| 5,132,931 A | 7/1992 | Koker | |
| 5,150,330 A | 9/1992 | Hag | |
| 5,181,205 A | 1/1993 | Kertis | |
| 5,193,072 A | 3/1993 | Frenkil | |
| 5,193,074 A | 3/1993 | Anami | |
| 5,214,610 A | 5/1993 | Houston | |
| 5,222,047 A | 6/1993 | Matsuda | |
| 5,241,503 A | 8/1993 | Cheng | |
| 5,249,165 A | 9/1993 | Toda | |
| 5,251,178 A | 10/1993 | Childers | |
| 5,253,214 A | 10/1993 | Herrmann | |
| 5,263,002 A | 11/1993 | Suzuki | |
| 5,267,215 A | 11/1993 | Tsujimoto | |
| 5,274,596 A | 12/1993 | Watanabe | |
| 5,291,444 A | 3/1994 | Scott | |
| 5,301,162 A | 4/1994 | Shimizu | |
| 5,301,278 A | 4/1994 | Bowater et al. | |
| 5,305,280 A | 4/1994 | Hayano | |
| 5,321,646 A | 6/1994 | Tomishima | |
| 5,337,283 A | 8/1994 | Ishikawa | |
| 5,343,438 A | 8/1994 | Choi | |
| 5,347,648 A * | 9/1994 | Stamm | G06F 9/3836 711/E12.024 |
| 5,383,159 A | 1/1995 | Kubota | |
| 5,390,308 A | 2/1995 | Ware et al. | |
| 5,406,526 A | 4/1995 | Sugibayashi | |
| 5,414,662 A | 5/1995 | Foss | |
| 5,418,737 A | 5/1995 | Tran | |
| 5,428,389 A | 6/1995 | Ito | |
| 5,455,802 A | 10/1995 | McClure | |
| 5,463,756 A | 10/1995 | Saito et al. | |
| 5,471,425 A | 11/1995 | Yumitori | |
| 5,485,430 A | 1/1996 | McClure | |
| 5,517,456 A | 5/1996 | Chishiki | |
| 5,587,960 A | 12/1996 | Ferris | |
| 5,636,367 A | 6/1997 | Stones et al. | |
| 5,892,900 A | 4/1999 | Ginter et al. | |
| 5,903,509 A | 5/1999 | Ryan et al. | |
| 5,933,387 A | 8/1999 | Worley | |
| 6,034,878 A | 3/2000 | Osaka et al. | |
| 6,075,728 A | 6/2000 | Inoue | |
| 6,240,039 B1 | 5/2001 | Lee et al. | |
| 6,327,192 B1 | 12/2001 | Lee | |
| 6,333,940 B1 | 12/2001 | Baydar et al. | |
| 6,373,761 B1 | 4/2002 | Shore et al. | |
| 6,526,484 B1 | 2/2003 | Stacovsky et al. | |
| 7,106,636 B2 | 9/2006 | Eilert et al. | |
| 7,249,232 B2 | 7/2007 | Halbert et al. | |
| 2001/0007538 A1 | 7/2001 | Leung | |
| 2001/0030900 A1 | 10/2001 | Kawaguchi et al. | |
| 2001/0044885 A1 | 11/2001 | LaBerge | |
| 2003/0174573 A1 | 9/2003 | Suzuki et al. | |
| 2004/0120197 A1 | 6/2004 | Kondo et al. | |
| 2005/0027929 A1 | 2/2005 | Hsu et al. | |
| 2005/0073894 A1 | 4/2005 | Roohparvar | |
| 2007/0094460 A1 | 4/2007 | Marty et al. | |

OTHER PUBLICATIONS

Garrett Jr., Billy, U.S. Appl. No. 12/393,265, filed Feb. 26, 2009, re Final Office Action dated Aug. 26, 2011. 13 pages.

Garrett Jr., Billy, U.S. Appl. No. 12/393,265, filed Feb. 26, 2009, re Office Action dated Feb. 10, 2011. 15 pages.

Garrett Jr., Billy, U.S. Appl. No. 12/393,265, filed Feb. 26, 2009, re Pre-Appeal Brief Request for Review dated Nov. 17, 2011, Including Notice of Appeal. 9 pages.

Garrett Jr., Billy, U.S. Appl. No. 12/393,265, filed Feb. 26, 2009, re Office Action dated May 7, 2012. 19 pages.

Giacalone et al., "SP23.2: A 1MB, 100MHz Integrated L2 Cache Memory with 128b Interface and ECC Protection," IEEE ISSCC, Feb. 1996, pp. 370-371/475. 3 pages.

Hirose et al., "A 20-ns. 4-Mb CMOS SRAM with Hierarchical Word Decoding Architecture," IEEE, Oct. 1990, pp. 1068-1072, vol. 25, No. 5. 8 pages.

International Search Report and Written Opinion dated Jan. 26, 2006 in International Application No. PCT/US2005/032770. 9 pages.

International Search Report and Written Opinion dated Jan. 4, 2006 in International Application No. PCT/US2005/028728. 5 pages.

JEDEC, "Minutes of Meeting No. 71, JC-42.3 Committee on RAM Memories," Including Proposal to Add Number of Banks Option to the Mode Register for 64M SDRAM, Joint Electron Device Engineering Council (JEDEC), May 25, 1994, New York, pp. 1-14 plus Attachment T. 8 pages.

Koike et al., "SP23.1: A 60ns 1Mb Nonvolatile Ferroelectric Memory with Non-Driven Cell Plate Line Write/Read Scheme," ISSCC, Feb. 10, 1996, pp. 368-379, 475. 3 pages.

Konishi et al., "Session XVIII: STATIC RAMs, FAM 18.6: A 64Kb CMOS RAM," IEEE International Solid State Circuits Conference, Feb. 12, 1982, pp. 258-259. 3 pages.

Micron, "Graphics DDR3 DRAM," Advance, "256 Mb x 32 GDDR3 DRAM," © 2003 Micron Technology, Inc., pp. 1-67. 67 pages.

Nakamura et al., "FA14.2: A 29ns 64Mb DRAM with Hierarchical Array Architecture," ISSCC, Feb. 1995, pp. 246-247, 373. 3 pages.

Nitta et al., "SP23.5: A 1.6GB/s Data-Rate 1Gb Synchronous DRAM with Hierarchical Square-Shaped Memory Block & Distributed Bank Architecture," IEEE ISSCC Digest of Technical Papers, pp. 376-377, 477, Feb. 10, 1996. 3 pages.

Garrett Jr., Billy, U.S. Appl. No. 12/393,265, filed Feb. 26, 2009, re Non-Final Office Action dated Aug. 4, 2010. 12 pages.

Garrett Jr., Billy, U.S. Appl. No. 12/393,265, filed Feb. 26, 2009, re Response dated Oct. 29, 2010 to the Office Action dated Aug. 4, 2010. 11 pages.

Garrett Jr., Billy, U.S. Appl. No. 12/393,265, filed Feb. 26, 2009, re Response dated Jun. 13, 2011 to the Office Action mailed Feb. 10, 2011. 9 pages.

Saeki et al., "SP 23.4: A 2.5 ns. Clock Access 250MHz 256Mb SDRAM with a Synchronous Mirror Delay," IEEE ISSCC Digest of Technical Papers, pp. 374-375, 476, Feb. 10, 1996. 3 pages.

Sakata et al., "Two-Dimensional Power-Line Selection Scheme for Low Subthreshold-Current Multi-Gigabit DRAM's," IEEE Journal of Solid State Circuits, vol. 29, No. 8, Aug. 1994, pp. 887-893. 9 pages.

Sugibayashi et al., "A 30-ns. 256-Mb DRAM with a Multidivided Array Structure," IEEE, Nov. 1993, pp. 1092-1098, vol. 28, No. 11. 8 pages.

Sugibayashi et al., "WP3.5: A 30-ns 256Mb DRAM with Multi-Divided Array Structure," ISSCC Feb. 1993, pp. 50-51, 262. 3 pages.

(56) References Cited

OTHER PUBLICATIONS

Ware, Frederick A., "Direct RDRAM 256/288-Mbit (512Kx16/18x32s) Data Sheet," Preliminary Information, Rambus Inc., Document DL0060 Version 0.90, 1999, pp. 1-66. 66 pages.

Yamashita et al., "FA 15.2: A 3.84 GIPS Integrated Memory Array Processor LSI with 64 Processing Elements and 2-Mb SRAM," IEEE International Solid-State Circuit Conference, pp. 260-261, Feb. 1994. 3 pages.

Yoo et al., "17.7: A 1.8V 700Mb/s/pin 512Mb DDR-II SDRAM with On-Die Termination and Off-Chip Driver Calibration", ISSCC, Feb. 2003, pp. 312-313, 495, 250-251, 535. 6 pages.

Yoo et al., "A 150 MHZ 8-Banks 256M Synchronous DRAM with Wave Pipelining Methods," IEEE ISSCC, Digest of Technical Papers, pp. 250-251, 374, Feb. 17, 1995. 3 pages.

Yoo et al., "SP23.6 A 32-Bank 1Gb DRAM with 1GB/s Bandwidth," ISSCC, Feb. 1996, pp. 378-379, 477. 3 pages.

\* cited by examiner

FIG. 11

MECHANISM FOR ENABLING FULL DATA BUS UTILIZATION WITHOUT INCREASING DATA GRANULARITY

CROSS-REFERENCE TO RELATED APPLICATIONS

This application is a continuation of U.S. patent application Ser. No. 13/720,585, filed Dec. 19, 2012 for "MECHANISM FOR ENABLING FULL DATA BUS UTILIZATION WITHOUT INCREASING DATA GRANULARITY," which in turn is a continuation of U.S. patent application Ser. No. 12/393,265, filed Feb. 26, 2009 for "MECHANISM FOR ENABLING FULL DATA BUS UTILIZATION WITHOUT INCREASING DATA GRANULARITY," now issued as U.S. Pat. No. 8,370,596, which in turn is a division of U.S. patent application Ser. No. 09/837,307 filed Apr. 17, 2001, also entitled "MECHANISM FOR ENABLING FULL DATA BUS UTILIZATION WITHOUT INCREASING DATA GRANULARITY," now issued as U.S. Pat. No. 7,500,075. Each of these prior applications is hereby incorporated by reference in its entirety.

FIELD OF THE INVENTION

This invention relates generally to storage technology, and more particularly to a mechanism for enabling full data bus utilization in a memory without increasing data granularity.

BACKGROUND

Dynamic random access memories (DRAM's) are used as main memory in many of today's computer systems. One of the factors that have led to the popularity of the DRAM has been the DRAM's simple cell structure. Because each DRAM storage cell consists of just a single capacitor, it is possible to pack a very large number of storage cells into a very small amount of chip space. Consequently, with DRAM technology, it is possible to manufacture very high-density, low cost memories.

With reference to FIG. 1, there is shown a functional diagram of a typical DRAM 100. As shown in FIG. 1, a DRAM 100 comprises a plurality of memory cells 102 arranged in a plurality of rows and columns. Each row of memory cells 102 is coupled to one of the wordlines 104 of the DRAM 100, and each column of memory cells 102 is coupled to one of the bitlines 106. By specifying a wordline 104 and a bitline 106, a particular memory cell 102 can be accessed.

To enable access to the various memory cells 102, there is provided a row decoder 112 and a column decoder 114. The row decoder 112 receives a row address on a set of address lines 116, and a row address strobe (RAS) signal on a control line 118, and in response to these signals, the row decoder 112 decodes the row address to select one of the wordlines 104 of the DRAM 100. The selection of one of the wordlines 104 causes the data stored in all of the memory cells 102 coupled to that wordline 104 to be loaded into the sense amplifiers (sense amps) 108. That data, or a portion thereof, may thereafter be placed onto the data bus 110 (for a read operation).

What portion of the data in the sense amps 108 is actually placed onto the data bus 110 in a read operation is determined by the column decoder 114. More specifically, the column decoder 114 receives a column address on the address lines 116, and a column address strobe (CAS) signal on a control line 120, and in response to these signals, the column decoder 114 decodes the column address to select one or more of the bitlines 106 of the DRAM 100. The number of bitlines 106 selected in response to a single column address may differ from implementation to implementation, and is referred to as the base granularity of the DRAM 100. For example, if each column address causes sixty-four bitlines 106 to be selected, then the base granularity of the DRAM 100 is eight bytes. Defined in this manner, the base granularity of the DRAM 100 refers to the amount of data that is read out of or written into the DRAM in response to each column address/CAS signal combination (i.e. each CAS or column command).

Once the appropriate bitlines 106 are selected, the data in the sense amps 108 associated with the selected bitlines 106 are loaded onto the data bus 110. Data is thus read out of the DRAM 100. Data may be written into the DRAM 110 in a similar fashion. A point to note here is that in a typical DRAM, the address lines 116 are multiplexed. Thus, the same lines 116 are used to carry both the row and column addresses to the row and column decoders 112, 114, respectively. That being the case, a typical memory access requires at least two steps: (1) sending a row address on the address lines 116, and a RAS on the control line 118; and (2) sending a column address on the address lines 116, and a CAS on the control line 120.

A timing diagram illustrating the various steps carried out during typical DRAM read cycles is shown in FIG. 2. As shown, to initiate a read cycle, a row address 208(1) is placed onto the address lines 116, and a RAS signal 202(1) is asserted on the RAS control line 118. Then, a column address 210(1) is sent onto the address lines 116, and a CAS signal 204(1) is asserted on the CAS control line 118. A short time thereafter, the data 206(1) stored at the locations indicated by the row address 208(1) and the column address 210(1) appear on the data bus 110. Data is thus extracted from the DRAM 100. After the first set of data 206(1) disappears from the data bus 110, a second read operation may be initiated. Like the first read operation, the second read operation begins with a row address 208(2) on the address lines 116, and a RAS signal 202(2) on the RAS control line 118. Then, a column address 210(2) is sent onto the address lines 116, and a CAS signal 204(2) is asserted on the CAS control line 118. A short time thereafter, the data 206(2) stored at the locations indicated by the row address 208(2) and the column address 210(2) appear on the data bus 110. The second read operation is thus completed. Additional successive reads may be carried out in a similar fashion.

Notice from the timing diagram of FIG. 2 that, for individual read cycles, there is substantial idle time between successive data sets 206 on the data bus 110. During this idle time, the data bus 110 is not utilized and no data is being transferred. The more idle time there is, the lower the utilization rate of the data bus 110, and the lower the utilization rate, the longer it will take for an external component (such as a CPU) to extract data from the DRAM 100. Since almost all operations of a computer require the use of memory, the longer it takes to get data from a memory, the slower the performance of the overall computer system. Thus, low bus utilization can have a direct negative impact on the overall performance of a computer system.

To improve data bus utilization, several techniques have been developed. One such technique involves the use of a "burst" mode of operation. Basically, in burst mode, rather than implementing just one column access for each RAS command, a plurality of column accesses are carried out for each RAS command. This results in consecutively accessing multiple sets of data from the same row of a DRAM 100. A timing diagram illustrating the operation of burst mode is shown in FIG. 3. More specifically, FIG. 3 depicts two burst mode read cycles, with each read cycle being directed to a different row of the DRAM.

To initiate a burst mode read cycle, a row address 308(1) is placed onto the address lines 116, and a RAS signal 302(1) is asserted on the RAS control line 118. Then, a column address 310(1) is sent onto the address lines 116, and a CAS signal 304(1) is asserted on the CAS control line 118. In response to the column address 310(1) and the CAS signal 304(1), the DRAM internally generates a plurality of additional column addresses. These additional column addresses are generated based upon the column address 310(1) that is provided, and a predetermined scheme. For example, the additional column addresses may be generated by incrementing the provided column address 310(1), decrementing the column address 310(1), or by manipulating the column address 310(1) in some other manner. The number of additional column addresses generated by the DRAM depends upon the burst length that the DRAM is implementing. In the example shown in FIG. 3, the burst length is four; thus, three additional column addresses are generated by the DRAM.

As the provided column address 310(1) is received, and as each additional column address is generated, they are applied by the DRAM to access a particular set of data. These addresses are applied in succession so that multiple sets of data are accessed from the same row of the DRAM. A short time after the application of each column address, data 306 stored at the locations indicated by the row address 308(1) and the applied column address starts to appear on the data bus 110. Because this data 306 is extracted from the DRAM 100 in response to consecutive applications of column addresses, there is no idle time between the sets of data 306(1)-306(4) on the data bus 110. As a result, data bus utilization is improved.

After the first set of data 306(1)-306(4) disappears from the data bus 110, a second burst mode read operation may be initiated. Like the first read operation, the second read operation begins with a row address 308(2) on the address lines 116, and a RAS signal 302(2) on the RAS control line 118. Then, a column address 310(2) is sent onto the address lines 116, and a CAS signal 304(2) is asserted on the CAS control line 118. In response, the DRAM generates three additional column addresses, and applies the provided column address 310(2) and the additional column addresses in succession to access multiples set of data from the same row. Shortly after each column address is applied, data 306 stored at the locations indicated by the row address 308(2) and the applied column address appears on the data bus 110. Because this data 306 is extracted from the DRAM 100 in response to consecutive applications of column addresses, there is again no idle time between the sets of data 306(5)-306(8) on the data bus 110. The second read operation is thus completed. Additional successive reads may be carried out in a similar fashion.

Several aspects of burst mode operation should be noted. First, notice that burst mode significantly increases output data granularity. More specifically, because a burst mode memory request involves multiple column accesses, the data extracted from the DRAM in response to a burst mode request is not just one base granularity in size, but rather is a multiple of the base granularity, where the multiple is equal to the burst length. Thus, in the example shown in FIG. 3, the output data granularity of the DRAM is four times the base granularity. This may pose a problem in some implementations. For example, in some applications, a CPU may wish to access only one base granularity of data at a time. If burst mode is implemented in such an application, then all of the data after the first granularity will be dropped by the CPU. In such a case, even though data bus utilization is improved by the use of burst mode, overall system efficiency is not improved because the extra data from the memory is not used. From an efficiency point of view, the end result is the same as if burst mode were not implemented at all. In such applications, burst mode does not provide a useful solution.

A second aspect to note is that burst mode eliminates data bus idle time only so long as the same row is being accessed. As soon as a different row is accessed, a significant amount of idle time is introduced on the data bus 110, as shown in FIG. 3. Thus, in applications where access of the DRAM switches from row to row on a regular basis (as is often the case), there is a substantial amount of idle time on the data bus 110, even if burst mode is implemented.

To further improve data bus utilization, burst mode may be implemented in conjunction with a multi-bank DRAM to achieve full data bus utilization. In a multi-bank DRAM, the DRAM is divided into multiple "banks", which may be viewed as "virtual memories" within the DRAM. Each bank may be accessed individually, and each bank has its own set of sense amps. However, all banks share the same data bus. A block diagram of a sample multi-bank DRAM 400 is shown in FIG. 4. While FIG. 4 shows a DRAM 400 having four banks 404, it should be noted that more or fewer banks may be implemented if so desired. The basic concept behind a multi-bank DRAM 400 is that higher bus utilization may be achieved by "interleaving" or alternating memory requests between the different banks 404. By interleaving the memory requests, it is possible to initiate memory access to one bank (e.g. 404(1)) while another bank (e.g. 404(2)) is busy delivering data onto the data bus. By doing so, the data bus idle time of one bank is used advantageously by the other bank to put data onto the data bus 410. Because all banks 404 are using the same data bus 410, interleaving the memory requests in this way makes it possible to keep the data bus 410 constantly filled, even when different rows are being accessed.

To illustrate how burst mode and interleaving may be used to achieve full data bus utilization, reference will now be made to the timing diagram of FIG. 5. In FIG. 5, a RAS1 signal is used to indicate a RAS signal applied to bank 1 404(1), while a RAS2 signal is used to indicate a RAS signal applied to bank 2 404(2), and so on. Likewise, a CAS1 signal indicates a CAS signal being applied to bank 1 404(1), while a CAS2 signal indicates a CAS signal being applied to bank 2 404(2), and so on.

As shown in FIG. 5, a read operation from bank 1 404(1) of the DRAM 400 is initiated by first sending an asserted RAS signal 502(1) and a row address 508(1) to bank 1 404(1). Then, at a later time, an asserted CAS signal 504(1) and a column address 510(1) are sent to bank 1 404(1). A short time thereafter, data associated with the row address 508(1) and the column address 510(1) are sent onto the data bus 410 (FIG. 4) by the sense amps 408(1) of bank 1 404(1). In the timing diagram shown in FIG. 5, it is assumed that bank 1 404(1) implements a burst mode length of two. Thus, in response to the one column address 510(1), two sets of data 506(1), 506(2) are outputted onto the data bus 410 by bank 1 404(1).

After the RAS signal 502(1) is sent to bank 1 404(1) but before the CAS signal 504(1) is sent to bank 1 404(1), an asserted RAS signal 502(2) and a row address 508(2) are sent to bank 2 404(2) of the DRAM 400. In addition, an asserted CAS signal 504(2) and a column address 510(2) are sent to bank 2 404(2) at a later time. In response to these signals, bank 2 404(2) outputs data associated with the row address 508(2) and the column address 510(2) onto the data bus 410 using the sense amps 408(2). As was the case with bank 1 404(1), bank 2 404(2) also implements a burst mode length of two. As a result, two sets of data 506(3), 506(4) are outputted onto the data bus 410 by bank 2 404(2) in response to the one column address 510(2). These sets of data 506(3), 506(4) immediately follow the sets of data 506(1), 506(2) outputted by bank 1; thus, there is no idle time between the data sets.

After the RAS signal 502(2) is sent to bank 2 404(2) but before the CAS signal 504(2) is sent to bank 2 404(2), an asserted RAS signal 502(3) and a row address 508(3) are sent to bank 3 404(3). A short time thereafter, an asserted CAS signal 504(3) and a column address 510(3) are sent to bank 3 404(3). In response, bank 3 404(3) outputs data associated with row address 508(3) and column address 510(3) onto the data bus 410 using the sense amps 408(3). As was the case with bank 1 and bank 2 404(2), bank 3 404(3) also implements a burst mode length of two. As a result, two sets of data 506(5), 506(6) are outputted onto the data bus 410 by bank 3 404(3) in response to the one column address 510(3). These sets of data 506(5), 506(6) immediately follow the sets of data 506(3), 506(4) outputted by bank 2; thus, there is no idle time between the data sets.

To finish the example, after the RAS signal 502(3) is sent to bank 3 404(3) but before the CAS signal 504(3) is sent to bank 3 404(3), an asserted RAS signal 502(4) and a row address 508(4) are sent to bank 4 404(4). A short time later, an asserted CAS signal 504(4) and a column address 510(4) are sent to bank 4 404(4). In response, bank 4 404(4) outputs data associated with row address 508(4) and column address 510 (4) onto the data bus 410 using the sense amps 408(4). As was the case with the other banks, bank 4 404(4) implements a burst mode length of two. As a result, two sets of data 506(7), 506(8) are outputted onto the data bus 410 by bank 4 404(4) in response to the one column address 510(4). These sets of data 506(7), 506(8) immediately follow the sets of data 506 (5), 506(6) outputted by bank 3; thus, there is no idle time between the data sets.

While bank 4 404(4) is being accessed, access of bank 1 404(1) may again be initiated with a RAS signal and a row address, as shown, to extract more data from that bank. This process of interleaving accesses between the various banks 404 may continue indefinitely to continually access data from the DRAM 400. By combining burst mode operation with a multi-bank DRAM 400 as shown in this example, it is possible to achieve full data bus utilization.

In practice, a certain number of banks are needed to achieve full data bus utilization in a particular DRAM, where the number of banks needed is determined by certain timing parameters of the DRAM. One relevant timing parameter is the minimum time required between consecutive RAS signals to the same bank. This parameter, denoted herein as Trc, is often referred to as the RAS cycle time. Another relevant parameter is the amount of time it takes to place one base granularity of data onto the data bus. This parameter is denoted herein as Dt. To determine the number of banks needed to achieve full data bus utilization, Trc is divided by n*Dt where n is the burst length. If, for example, Trc is 80 ns and Dt is 10 ns and the DRAM is implementing a burst length of two, then the number of banks needed is 80 ns/20 ns or four. With these timing parameters (which are typical) and four banks, a DRAM can achieve full data bus utilization.

While the combination of burst mode and a multi-bank DRAM 400 makes it possible to achieve 100% data bus utilization in a memory, this implementation does not come without its drawbacks. One significant drawback is that it still relies upon burst mode to achieve full data bus utilization. Because of this reliance, this implementation suffers from the same shortcoming as that experienced in regular burst mode. Namely, it increases the data granularity of the DRAM 400. Notice from the timing diagram of FIG. 5 that instead of outputting just one base granularity of data per access to each bank, the DRAM 400 outputs two (it is two in the example shown in FIG. 5 but it could more than two in other implementations). This increase in data granularity can lead to inefficiency.

As noted previously, in some applications, an external component (such as a CPU) may wish to access only one base granularity of data at a time. In such applications, any data provided after the first base granularity will be dropped. If burst mode is implemented in such an application, at least half of the data provided by the DRAM 400 will be dropped, which means that at most 50% efficiency can be achieved. Thus, even though burst mode combined with a multi-bank DRAM 400 may achieve 100% data bus utilization in such an application, it does not improve overall system efficiency because the extra data is not used. Consequently, the burst mode/multi-bank DRAM combination does not provide a complete solution for all possible applications.

As an alternative to the burst mode/multi-bank DRAM combination, a plurality of separate DRAM's may be implemented to achieve full data bus utilization. By interleaving memory requests between separate DRAM's instead of between separate banks within a single DRAM, it is possible to achieve full data bus utilization without requiring an increase in data granularity. This result comes with extra cost and complexity, however. To illustrate how separate DRAM's may be used to achieve full data bus utilization, reference will be made to FIGS. 6 and 7. Specifically, FIG. 6 shows a block diagram of a sample multi-DRAM implementation, while FIG. 7 shows a timing diagram for several read cycles of the implementation of FIG. 6.

As shown in FIG. 6, the sample implementation comprises a plurality of separate DRAM's 604(1), 604(2) (more than two may be implemented if so desired), with each DRAM 604 having its own separate command lines 608(1), 608(2), and address lines 606(1), 606(2). Both DRAM's share the same data bus 620, and both have 2 banks. In addition to the DRAM's 604(1), 604(2), the implementation further comprises a controller 602 for controlling the interleaving of requests between the DRAM's 604(1), 604(2). It is the responsibility of this controller 602 to manage the interleaving of memory requests such that: (1) the data bus 620 is used as fully as possible; and (2) there is no bus contention on the data bus 620.

To illustrate how the implementation of FIG. 6 can be used to achieve full data bus utilization, reference will be made to the timing diagram of FIG. 7. For clarity purposes, RAS1,1 is used in FIG. 7 to indicate a RAS command applied to DRAM 1 604(1), bank 1, while RAS2,1 is used to indicate a RAS command applied to DRAM 2 604(2), bank 1, and so on. Likewise, CAS1,1 is used to indicate a CAS command being applied to DRAM 1 604(1), bank 1, while CAS2,1 is used to indicate a CAS command being applied to DRAM 2 604(2), bank 1.

As shown in FIG. 7, to extract data from the DRAM's 604(1), 604(2), the controller 602 first initiates a read operation on DRAM 1 604(1), bank 1. This is carried out by sending a RAS command 702(1) and a row address 706(1) to DRAM 1 604(1), bank 1. Then, a CAS command 704(1) and a column address 706(2) are sent to DRAM 1 604(1), bank 1. A short time thereafter, data 720(1) associated with the row address 706(1) and the column address 706(2) are outputted onto the data bus 620 (FIG. 6) by DRAM 1 604(1), bank 1. While the CAS command 704(1) and the column address 706(2) are being sent to DRAM 1 604(1), bank 1, the controller 602 also sends a RAS command 712(1) and a row address 716(1) to DRAM 2 604(2), bank 1. Thereafter, a CAS command 714(1) and a column address 716(2) are sent to DRAM 2 604(2), bank 1. In response to these signals, DRAM 2 604(2), bank 1, outputs data 720(2) associated with the row address 716(1) and the column address 716(2) onto the data bus 620. This set of data 720(2) immediately follows the set of data 720(1) outputted by DRAM 1 604(1), bank 1; thus, there is no idle time between the data sets.

While the CAS signal 714(1) and the column address 716(2) are being sent to DRAM 2 604(2), bank 1, a RAS command 702(2) and row address 706(3) are sent to DRAM 1 604(1), bank 2, to initiate another read cycle. Thereafter, a CAS command 704(2) and a column address 706(4) are sent to DRAM 1 604(1), bank 2. In response, DRAM 1 604(1), bank 2, outputs data 720(3) associated with the row address 706(3) and the column address 706(4) onto the data bus 620. This set of data 720(3) immediately follows the set of data 720(2) outputted by DRAM 2 604(2), bank 1; thus, there is again no idle time between the data sets. To finish the example, while the CAS command 704(2) and the column address 706(4) are being sent to DRAM 1 604(1), bank 2, the controller 602 initiates a read cycle on DRAM 2 604(2), bank 2, by sending a RAS command 712(2) and a row address 716(2) to DRAM 2 604(2), bank 2. Thereafter, a CAS command 714(2) and a column address 716(4) are sent to DRAM 2 604(2), bank 2. In response to these signals, DRAM 2 604(2), bank 2, outputs data 720(4) associated with the row address 716(3) and the column address 716(4) onto the data bus 620. This set of data 720(4) immediately follows the set of data 720(3) outputted by DRAM 1 604(1), bank 2; hence, there is no idle time between the data sets. Additional read operations may be carried out in this manner to continue extracting data from the DRAM's 604(1), 604(2). As this example illustrates, by interleaving memory requests between multiple banks of multiple DRAM's, it is possible to achieve full data bus utilization, and because no burst mode is implemented, data granularity is not increased.

While the multi-DRAM implementation is able to achieve full data bus utilization without increasing data granularity, it does so at a significant cost. First, due to the tight timing constraints, the DRAM's shown in FIG. 6 are very fast and very expensive. With multiple DRAM's being required to implement the system of FIG. 6, the cost of the memory system can be prohibitive. Compared to single DRAM memory systems, the cost of this multi-DRAM system can be several-fold. Also, the multi-DRAM implementation is limited in its application. By its very nature, it can be implemented only in a multi-DRAM environment. In the many applications in which it is desirable to implement just one DRAM, the multi-DRAM implementation cannot be used. In addition, this implementation can add substantial complexity to the memory access process. Because the controller 602 must concurrently control multiple DRAM's, the memory access process is much more complex and difficult to manage than in a single DRAM implementation. Overall, there is a significant price to pay for the functionality provided by the multi-DRAM configuration, and in many implementations, this price is prohibitive. Hence, the multiple DRAM approach does not provide a viable solution for all applications.

SUMMARY

In view of the shortcomings of the prior art, the present invention provides an improved mechanism, which enables full data bus utilization to be achieved within a memory, but which does not increase the data granularity of the memory or require multiple memories to be implemented. In accordance with one embodiment, there is provided a memory comprising a first memory portion, a second memory portion, and an interface. To enable the memory portions to be manipulated independently, the memory portions in one embodiment are electrically isolated from each other. In one embodiment, this electrical isolation is achieved by physically placing the interface between the memory portions. In addition, the interface is adapted, in one embodiment, to enable it to receive a row command and a column command in the time it takes to cycle the memory once (to read one base granularity of data out of or write one base granularity of data into the memory). With such a memory, it is possible to achieve full data bus utilization without increasing data granularity.

In one embodiment, full data bus utilization is achieved by interleaving access requests between the two memory portions. More specifically, the interface receives a first access request (comprising a row command and no more than one column command) on a set of control ports, and forwards the request on to the first memory portion for processing. In response, the first memory portion accesses a first set of data having a size of no more than one base granularity, and sends that data onto a data bus (assuming a read operation). A data set is thus extracted from the memory. Thereafter, the interface receives a second access request on the same set of control ports, and forwards the request to the second memory portion for processing. In response, the second memory portion accesses a second set of data also having a size of no more than one base granularity, and sends that data onto the data bus. If the access requests are timed properly relative to each other, then the second set of data will be sent onto the data bus immediately after the first set of data such that there is substantially no idle time on the data bus. With no data bus idle time, full data bus utilization is achieved. This full data bus utilization may be perpetually maintained by continuously interleaving access requests between the two portions. In one embodiment, proper relative timing between the various access requests is made possible, as least partially, by the fact that the memory portions are electrically isolated from each other, and hence, may be independently manipulated, and by the fact that a row command and a column command can be received by the interface in the time it takes to cycle either memory portion once.

Notice that full data bus utilization is achieved without increasing data granularity. More specifically, notice that burst mode does not need to be implemented, and that no more than one base granularity of data is sent onto the data bus in response to each access request. In addition, notice that full data bus utilization is achieved without implementing multiple memories. The different memory portions may behave like independent memories, but they are both part of the same memory using the same set of control ports. Thus, multiple memories need not be implemented. By achieving full data bus utilization without increasing data granularity and without implementing multiple memories, the present invention provides a significant advance over the prior art.

BRIEF DESCRIPTION OF THE DRAWINGS

FIG. 11 is a timing diagram illustrating an alternative operation of the memory of FIG. 9 wherein a single set of control ports/lines is used to send both row and column commands.

DETAILED DESCRIPTION OF EMBODIMENT(S)

Figure 8:
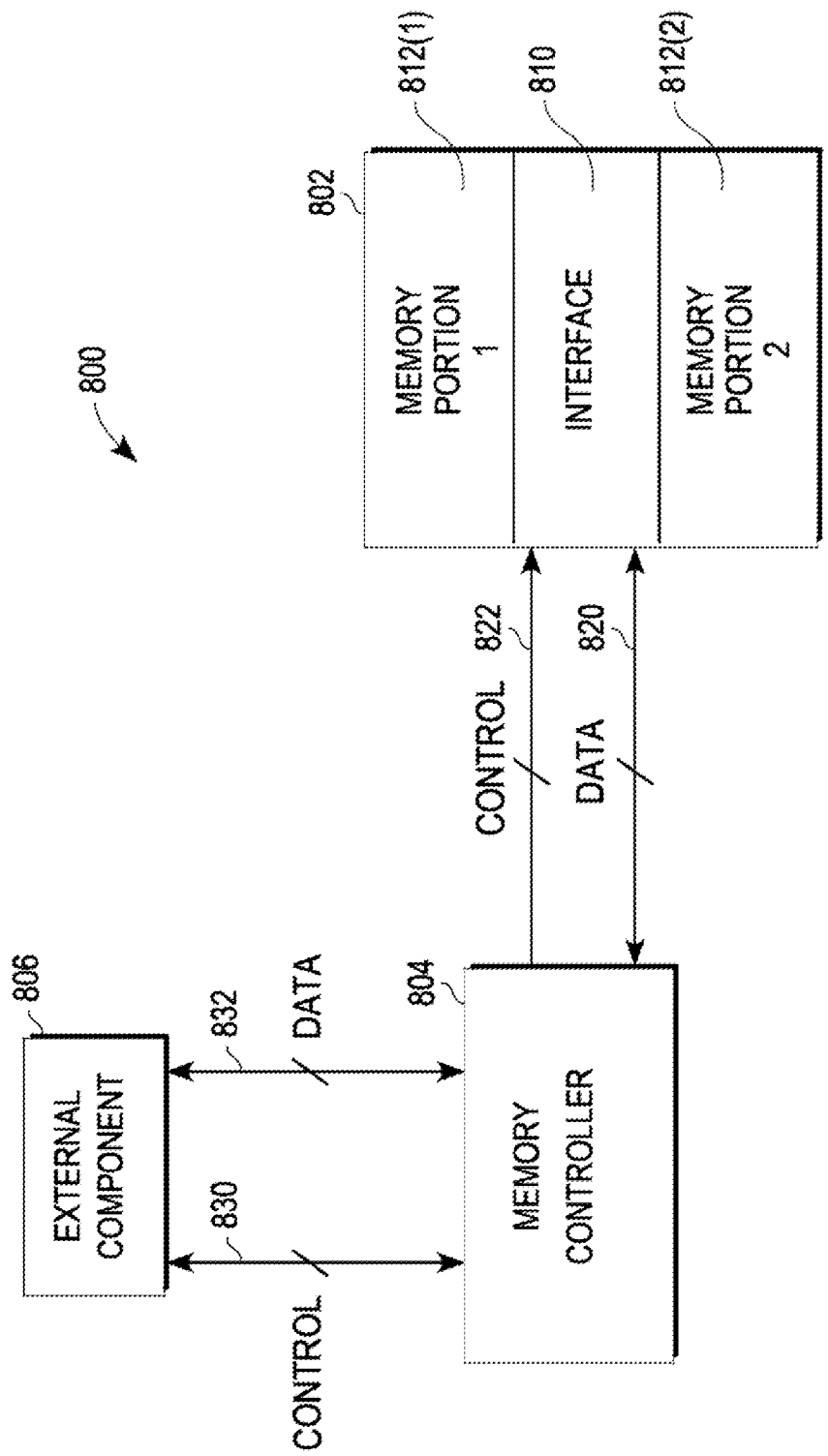
FIG. 8 is a block diagram of a system in which one embodiment of the present invention may be implemented.

With reference to FIG. 8, there is shown a block diagram of a system 800 in which one embodiment of the present invention may be implemented, the system 800 comprising a memory 802, a memory controller 804, and an external component 806. For purposes of illustration, it will be assumed in the following discussion that memory 802 is a dynamic random access memory (DRAM). However, it should be noted that the teachings of the present invention may be applied to other types of memory as well, if so desired. In one embodiment, memory 802 is implemented as an integrated circuit.

In system 800, the external component 806 (which may, for example, be a CPU executing a program) is the component that requires access to the memory 802 for purposes of writing data into the memory 802, reading data out of the memory 802, or both. To access the memory 802, the external component 806 submits requests to the memory controller 804 via a set of control 830 and data lines 832. In response, the memory controller 804 translates the requests into access requests that the memory 802 can understand, and sends the access requests to the memory 802 via another set of control 822 and data lines 820. In the case of a write, data is provided to the memory 802 via the data lines 820. In the case of a read, data is provided by the memory 802 to the controller 804 via the data lines 820.

The interface 810 of the memory 802 receives the access requests from the controller 804 and responds by accessing the memory portions 812(1), 812(2) of the memory 802. In one embodiment, the interface 810 accesses whichever portion 812(1), 812(2) is indicated in an access request. Since it is the controller 804 that generates the access requests, it is the controller 804 that controls which portions 812(1), 812(2) of the memory 802 are accessed and in what sequence. As will be discussed in a later section, it is desirable to interleave access requests between the different portions 812(1), 812(2) to achieve full data bus utilization. Since it is the controller 804 that controls which memory portions 812(1), 812(2) are accessed, it is up to the controller 804 to properly interleave the access requests between the portions 812(1), 812(2) to enable full data bus utilization. The operation of the controller 804 will be described in greater detail in a later section. In the embodiment shown in FIG. 8, the memory 802 is depicted as comprising two portions 812(1), 812(2). It should be noted that this is for illustrative purposes only. If so desired, the memory 802 may be implemented with any number of portions. Each portion 812 may comprise one or more banks. In the following description, for the sake of simplicity, it will be assumed that each portion 812 comprises one bank. However, it should be noted that for purposes of the present invention, each portion 812 may comprise 1 to n banks, where n is any integer.

Figure 9:
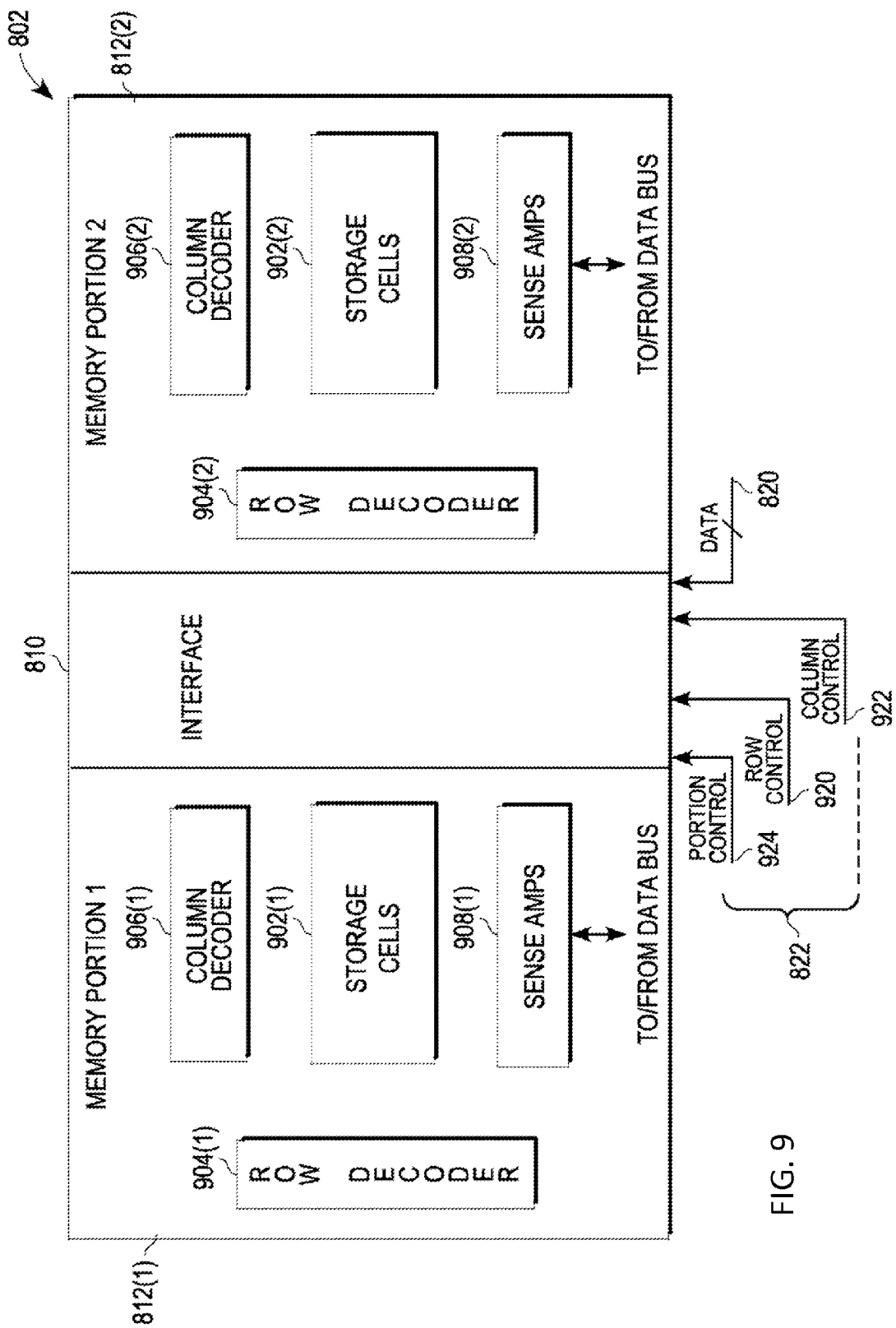
FIG. 9 is a detailed block diagram of a memory in accordance with one embodiment of the present invention.

With reference to the block diagram of FIG. 9, an embodiment of the memory 802 will now be described in greater detail. As shown in FIG. 9, the memory 802 comprises an interface 810, and two memory portions 812(1), 812(2). The first memory portion 812(1) comprises a bank with a plurality of memory/storage cells 902(1) arranged in rows and columns, and a row decoder 904(1) and column decoder 906(1) for facilitating access to the memory cells 902(1). In addition, the first memory portion 812(1) comprises a set of sense amps 908(1) coupled to a data bus 820 for receiving data therefrom and sending data thereto. Similarly, the second memory portion 812(2) comprises a bank with a plurality of memory/storage cells 902(2) arranged in rows and columns, and a row decoder 904(2) and column decoder 906(2) for facilitating access to the memory cells 902(2). In addition, the second memory portion 812(2) comprises a set of sense amps 908(2) coupled to the data bus 820 for receiving data therefrom and sending data thereto.

In one embodiment, the memory portions 812(1), 812(2) may be treated like independent memories. That is, each portion 812 may be accessed independently of the other portion 812 from a timing standpoint. More specifically, portion 812(1) may be accessed at any time relative to the accessing of portion 812(2), and portion 812(2) may be accessed at any time relative to the accessing of portion 812(1). Put another way, no timing constraint is imposed on when one portion may be accessed relative to the other. Thus, there is no minimum required time delay between accessing one portion 812(1) and accessing the other portion 812(2). This is quite different from typical DRAM's, which usually require a time delay between successive accesses to the same DRAM, even if it is to different banks. As will be explained further below, this "independent" nature of the memory portions 812 greatly facilitates the process of interleaving access requests between the portions 812(1), 812(2) to achieve full data bus utilization without increasing data granularity. At this point, it should be noted that while the memory portions 812(1), 812(2) may be treated like independent memories from an accessing point of view, they are still part of the same memory 802. They share the same data bus 820, the same interface 810, and the same control ports/lines 822. Thus, unlike the multi-DRAM implementation discussed previously, the memory 802 is a single memory, not multiple, separate memories.

In one embodiment, the independent nature of the memory portions 812 is derived from that fact that they are electrically isolated from each other. By electrically isolated, it is meant that the two portions 812(1), 812(2) are sufficiently decoupled from each other from an electrical noise standpoint that the access of one portion does not corrupt data in the other portion. More specifically, the activation of one set of sense amps 908 does not corrupt data in the other set of sense amps 908, regardless of the timing of the activations. As a result of this electrical isolation, it is possible to activate the sets of sense amps 908(1), 908(2) independently to process access requests without fear that processing an access request in one portion 812 will adversely affect the processing of an access request in the other portion.

In one embodiment, the electrical isolation between the memory portions 812(1), 812(2) is achieved by physically placing the interface 810 between the two portions 812(1), 812(2). The interface 810 provides a natural and convenient barrier between the two portions 812(1), 812(2) and works effectively to electrically isolate one portion 812(1) from the other 812(2). It should be noted that this is just one possible way of achieving electrical isolation between the portions 812(1), 812(2). The same result may be achieved in many other ways (e.g. improved sense amp circuits, better power supply control, circuit enhancements, etc.). All such means for electrically isolating the portions 812(1), 812(2) are within the scope of the present invention.

As noted above, both memory portions 812(1), 812(2) share the interface 810 and the control ports/lines 822. In one embodiment, the interface 810 receives all access requests via the control ports/lines 822 and forwards the requests on to the proper memory portion 812(1), 812(2) for processing. In effect, the interface 810 acts as a manager to manage the processing of access requests by the memory portions 812(1), 812(2). In carrying out its management function, the interface 810 receives several sets of information on the control ports/lines 822 from the controller 804 for each access request. In one embodiment, these sets of information include: (1) portion selection information 924 that specifies which memory portion 812(1), 812(2) is to be accessed; (2) row control information 920 that specifies which row of storage cells within a memory portion is to be accessed; and (3) column control information 922 that specifies which column or columns of storage cells within that row are to be accessed. Together, these sets of information provide all of the information needed to access one base granularity of data from one of the portions 812(1), 812(2) of the memory 802.

With regard to the row and column control information 920, 922, these sets of information may be sent in any desired format. For example, the row control information 920 may take the form of a row command (e.g. comprising a row address and a RAS) sent as a set of parallel bits, or it may take the form of a row command sent as a serialized packet, or it may take any other form. So long as sufficient information is provided to the interface 810 to instruct the interface 810 to access a particular row of storage cells, any row command format may be used. The same is true for the column control information 922. Specifically, the column control information 922 may take the form of a column command (e.g. comprising a column address and a CAS) sent as a set of parallel bits, or it may take the form of a column command sent as a serialized packet, or it may take any other form. So long as sufficient information is provided to the interface 810 to instruct the interface 810 to access one or more particular columns of storage cells, any column command format may be used.

In response to the control information on the control ports/lines 822, the interface 810 manages the operation of the memory portions 812(1), 812(2). In one embodiment, the interface 810 is capable of receiving both a row command and a column command from the controller 804 in an amount of time X, where X is less than or equal to the amount of time T it takes to cycle either of the memory portions 812(1), 812(2) once. Used in this context, the amount of time T it takes to cycle the memory 802 is the amount of time needed to read one base granularity of data out of, or write one base granularity of data into either portion 812(1), 812(2) of the memory 802. As defined previously, the base granularity of the memory 802 refers to the amount of data that is read out of or written into the memory 802 in response to each column command (when no burst mode is implemented). With this ability to receive both a row command and a column command in the time it takes to cycle the memory 802 once, the interface 810 greatly facilitates the process of achieving full data bus utilization without increasing data granularity. As will be explained more fully in a later section, the row command and the column command received by the interface 810 in the amount of time X may correspond to different access requests due to the process of pipelining.

Figure 10:
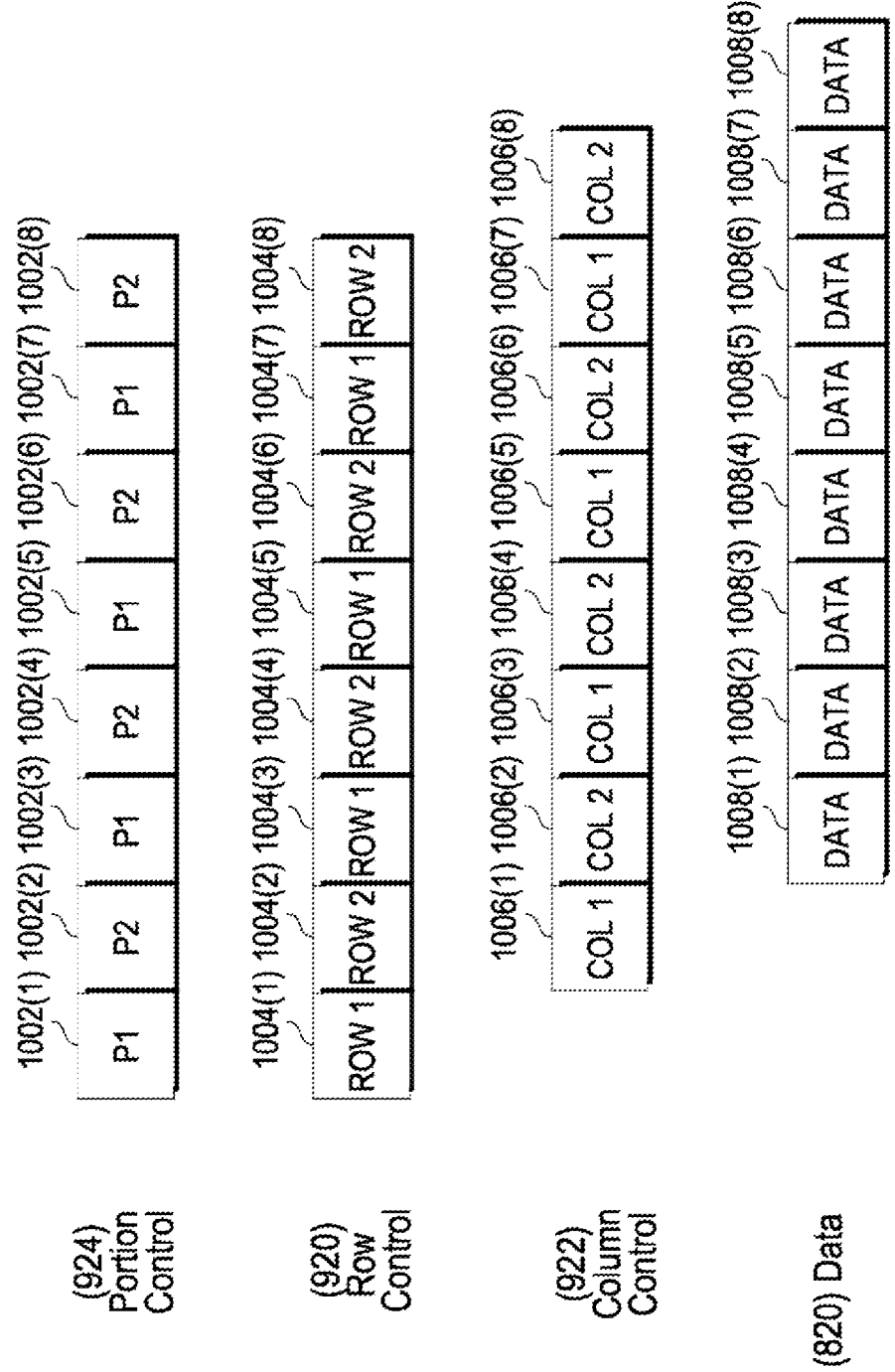
FIG. 10 is a timing diagram illustrating the operation of the memory shown in FIG. 9 during several read cycles.

To illustrate how the memory 802 may be used advantageously to achieve full data bus utilization, reference will now be made to the timing diagram of FIG. 10, which shows eight read access requests interleaved between the two portions 812(1), 812(2). For the sake of simplicity, FIG. 10 shows only read cycles. However, it should be noted that write operations may be carried out in a similar fashion. For purposes of explanation, the following nomenclature will be used in FIG. 10: (1) P1 will be used to indicate an access request to the first portion 812(1) of the memory, while P2 will be used to indicate an access request to the second portion 812(2); (2) Row1 will be used to indicate a row command to portion 812(1), while Row2 will be used to indicate a row command to portion 812(2); and (3) Col1 will be used to indicate a column command to portion 812(1), while Col2 will be used to indicate a column command to portion 812(2). With this in mind, the operation of the memory 802 will now be described.

Initially, the interface 810 receives a first access request from the controller 804 to read a set of data from the first portion 812(1) of the memory 802. This first access request comprises a portion indication 1002(1) sent on the portion control port/line 924, a row command 1004(1) sent on the row control ports/lines 920, and a column command 1006(1) sent on the column control ports/lines 922. In the embodiment shown, the row command 1004(1) is sent first and the column command 1006(1) is sent later. In a synchronous DRAM (SDRAM), the row command 1004(1) and the column command 1006(1) may be sent in consecutive clock cycles. Upon receiving this access request, the interface 810 determines that it is intended for the first memory portion 812(1); hence, it forwards the row command 1004(1) and the subsequent column command 1006(1) on to portion 812(1).

In response, the row decoder 904(1) of the first memory portion 812(1) decodes the row address contained in the row command 1004(1). This causes one of the rows of storage cells 902(1) to be accessed, and the data contained therein to be loaded into the sense amps 908(1). In addition, the column decoder 906(1) of the first portion 812(1) decodes the column address contained in the column command 1006(1), which causes a subset of the data contained in the sense amps 908(1) to be sent onto the data bus 820. This output data 1008(1) appears on the data bus 820 a short time after the first access request is received, and is one base granularity in size (because the access request contained only one column command and burst mode was not implemented). A first set of data 1008(1) is thus extracted from the memory 802.

While the first access request is being processed, the interface 810 receives a second access request from the controller 804 to read a set of data from the second portion 812(2) of the memory 802. This second access request comprises a portion indication 1002(2) sent on the portion control port/line 924, a row command 1004(2) sent on the row control ports/lines 920, and a column command 1006(2) sent on the column control ports/lines 922. As was the case with the first access request, the row command 1004(2) is sent first and the column command 1006(2) is sent later. Notice from the embodiment shown in FIG. 10 that the row command 1004(2) of the second access request is sent concurrently with the column command 1006(1) of the first access request. This pipelining of the different parts of different access requests facilitates the process of interleaving access requests to the different memory portions 812. In one embodiment, both the row command 1004(2) and the column command 1006(1) are received in an amount of time X, which is less than or equal to the time T needed to cycle either of the memory portions 812(1), 812(2) once. The ability of the controller 804 to send, and the ability of the interface 810 to receive, both a row command and a column command in an amount of time X less than or equal to T contributes to the system's ability to achieve full data bus utilization without increasing data granularity.

Another point to note in the example shown in FIG. 10 is that the row command 1004(2) of the second access request is received immediately after the row command 1004(1) of the first access request. There is no required minimum time delay between the two commands 1004(1), 1004(2). In an SDRAM, the row commands 1004(1), 1004(2) may be received in consecutive clock cycles. In one embodiment, this is made possible by the fact that the two memory portions 812(1), 812(2) are electrically isolated from each other, and hence, may be treated like independent memories. Because the two memory portions 812(1), 812(2) may be treated like independent memories, it is possible to receive and forward an access request to one of the memory portions 812(1), 812(1) without regard to the other. This in turn means that there is no timing restriction on when a row command may be sent to one memory portion relative to a row command being sent to the other memory portion. As will be discussed further below, this lack of a timing constraint between the row commands facilitates the process of achieving full data bus utilization without increasing data granularity.

Upon receiving the second access request, the interface 810 determines that it is intended for the second memory portion 812(2); hence, it forwards the request on to portion 812(2). In response, the row decoder 904(2) of the second memory portion 812(2) decodes the row address contained in the row command 1004(2). This causes one of the rows of storage cells 902(2) to be accessed, and the data contained therein to be loaded into the sense amps 908(2). In addition, the column decoder 906(2) of the second portion 812(2) decodes the column address contained in the column command 1006(2), which causes a subset of the data contained in the sense amps 908(2) to be sent onto the data bus 820. This output data 1008(2) appears on the data bus 820 a short time after the second access request is received, and like the first set of data 1008(1), is one base granularity in size. If the second access request is properly timed relative to the first access request, then the second set of data 1008(2) will be sent onto the data bus 820 immediately after the first set of data 1008(1) so that there is substantially no idle time between the data sets 1008(1), 1008(2). With no data bus idle time between the data sets 1008(1), 1008(2), full data bus utilization is achieved.

While the second access request is being processed, the interface 810 receives a third access request, this one being directed back to the first memory portion 812(1). Like the first two access requests, the third access request comprises a portion indication 1002(3), a row command 1004(3), and a column command 1006(3). The row command 1004(3) is received first and the column command 1006(3) is received later. As shown, the row command 1004(3) is received immediately after the row command 1004(2) of the second access request and is received concurrently with the column command 1006(2) of the second access request. The row command 1006(3) and the column command 1006(2) are received in an amount of time X, which is less than or equal to the amount of time T needed to cycle either of the memory portions 812(1), 812(2) once.

Upon receiving this third access request, the interface 810 determines that it is intended for the first memory portion 812(1); hence, it forwards the request on to portion 812(1). In response, the row decoder 904(1) and the column decoder 906(1) of the first portion 812(1) decode the row address and the column address contained in the row command 1006(3) and column command 1006(3), respectively, and cause a base granularity of data to be sent from the sense amps 908(1) onto the data bus 820 (in the manner already described). This output data 1008(3) appears on the data bus 820 a short time after the third access request is received, and like the first two sets of data 1008(1), 1008(2), is one base granularity in size. If the third access request is properly timed relative to the second access request, then the third set of data 1008(3) will be sent onto the data bus 820 immediately after the second set of data 1008(2). Thus, there is substantially no idle time between the data sets 1008(2), 1008(3), which in turn enables full data bus utilization to be achieved.

While the third access request is being processed, the interface 810 receives a fourth access request, this one being directed back to the second memory portion 812(2). Like the previous requests, the fourth access request comprises a portion indication 1002(4), a row command 1004(4), and a column command 1006(4). The row command 1004(4) is received first and the column command 1006(4) is received later. As shown, the row command 1004(4) is received immediately after the row command 1004(3) of the third access request and is received concurrently with the column command 1006(3) of the third access request. The row command 1006(4) and the column command 1006(3) are received in an amount of time X, which is less than or equal to the amount of time T needed to cycle either of the memory portions 812(1), 812(2) once.

Upon receiving this fourth access request, the interface 810 determines that it is intended for the second memory portion 812(2); hence, it forwards the request on to portion 812(2). In response, the row decoder 904(2) and the column decoder 906(2) of the second portion 812(2) decode the row address and the column address contained in the row command 1006(4) and column command 1006(4), respectively, and cause a base granularity of data to be sent from the sense amps 908(2) onto the data bus 820 (in the manner already described). This output data 1008(4) appears on the data bus 820 a short time after the third access request is received, and like the previous sets of data 1008(1), 1008(2), 1008(3), is one base granularity in size. If the fourth access request is properly timed relative to the third access request, then the fourth set of data 1008(4) will be sent onto the data bus 820 immediately after the third set of data 1008(3). Thus, there is substantially no idle time between the data sets 1008(3), 1008(4), which in turn enables full data bus utilization to be achieved. In the manner described, access requests may be continuously interleaved between the portions 812(1), 812(2) of the memory 802 to achieve sustained full data bus utilization, and since neither burst mode nor a multiple memory configuration is implemented, this full data bus utilization is achieved without increasing data granularity and without implementing multiple memories. Thus, full data bus utilization is achieved without the shortcomings of the prior art.

Figure 1:
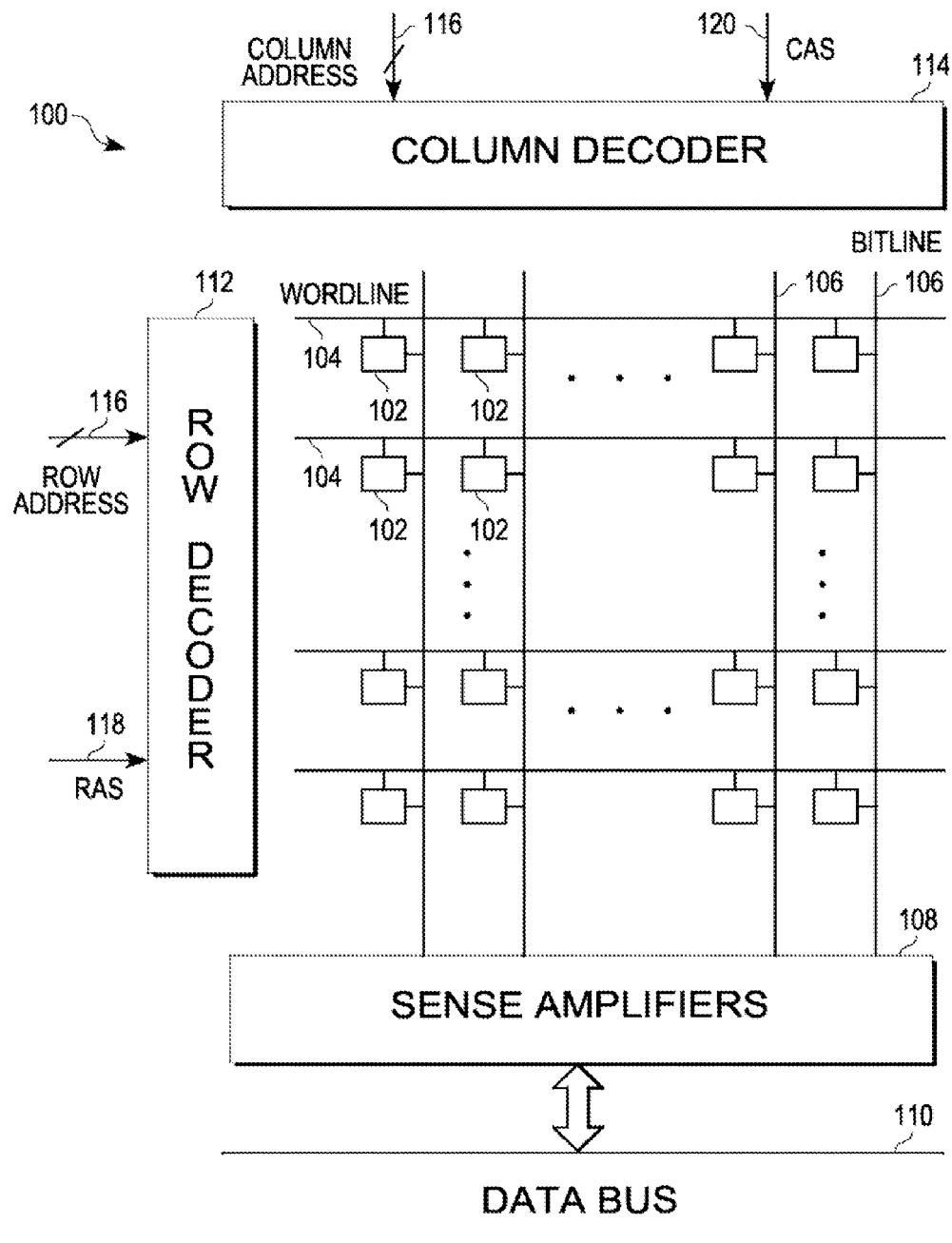
FIG. 1 is a functional diagram of a typical DRAM.
Figure 2:
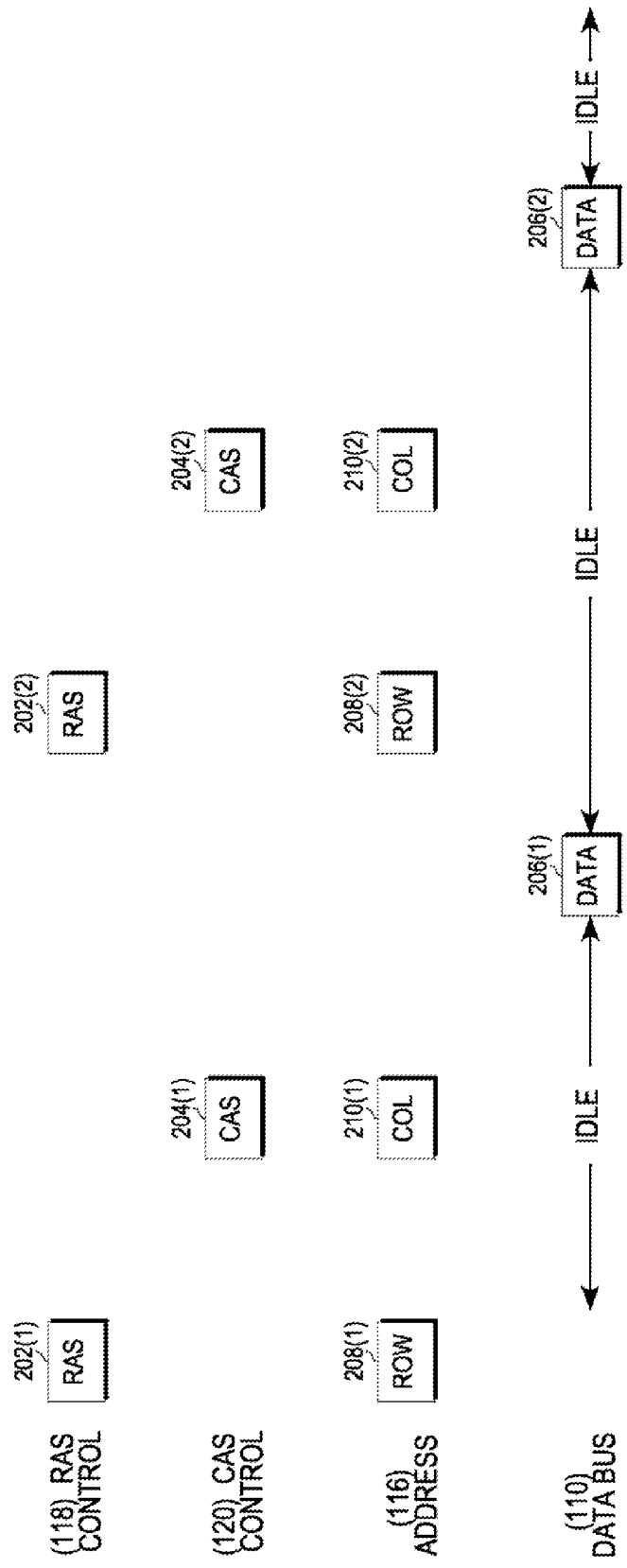
FIG. 2 is a timing diagram illustrating the steps carried out by the DRAM of FIG. 1 during several read cycles.
Figure 3:
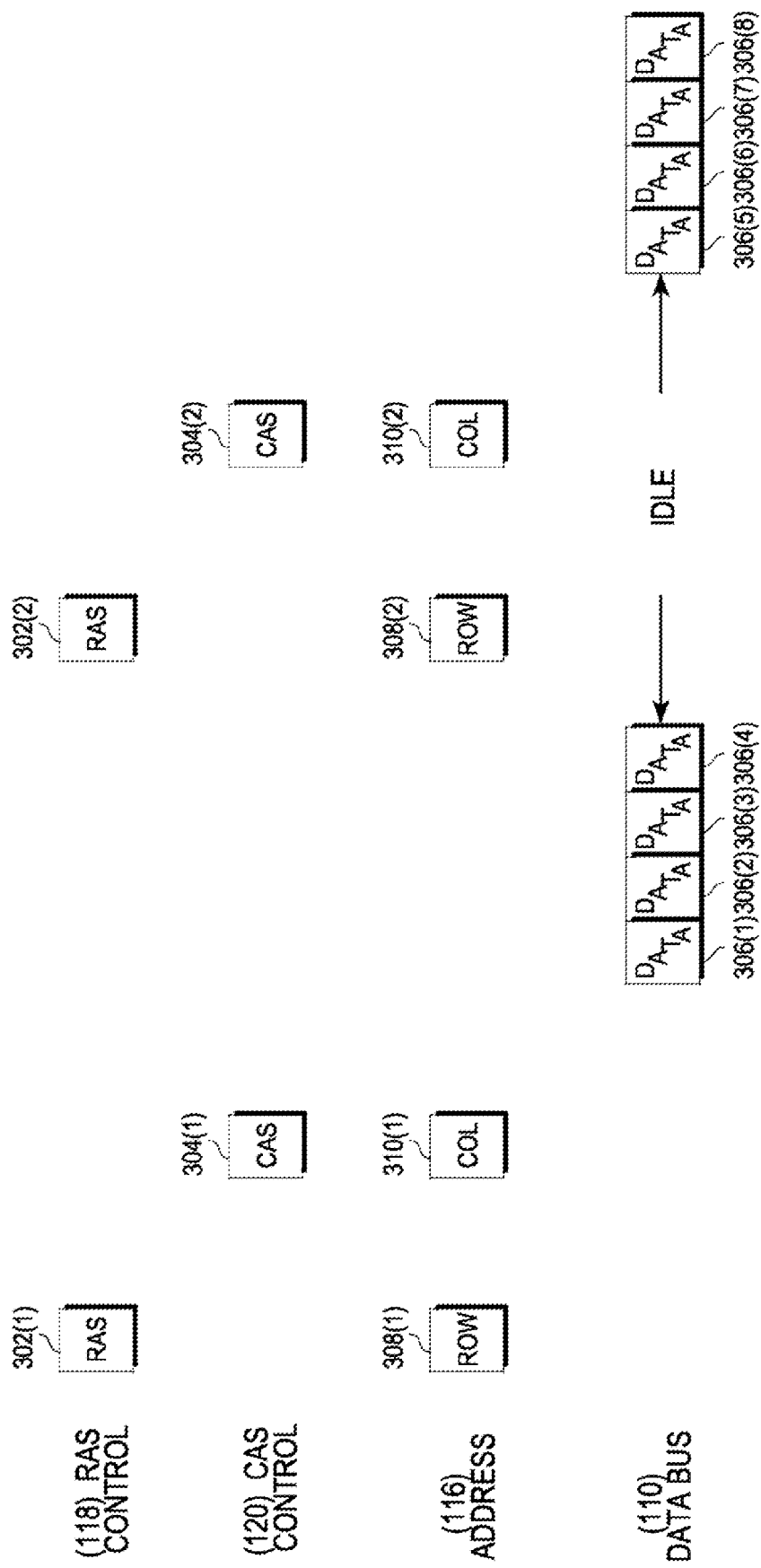
FIG. 3 is a timing diagram illustrating the steps carried out during several burst mode read cycles.
Figure 4:
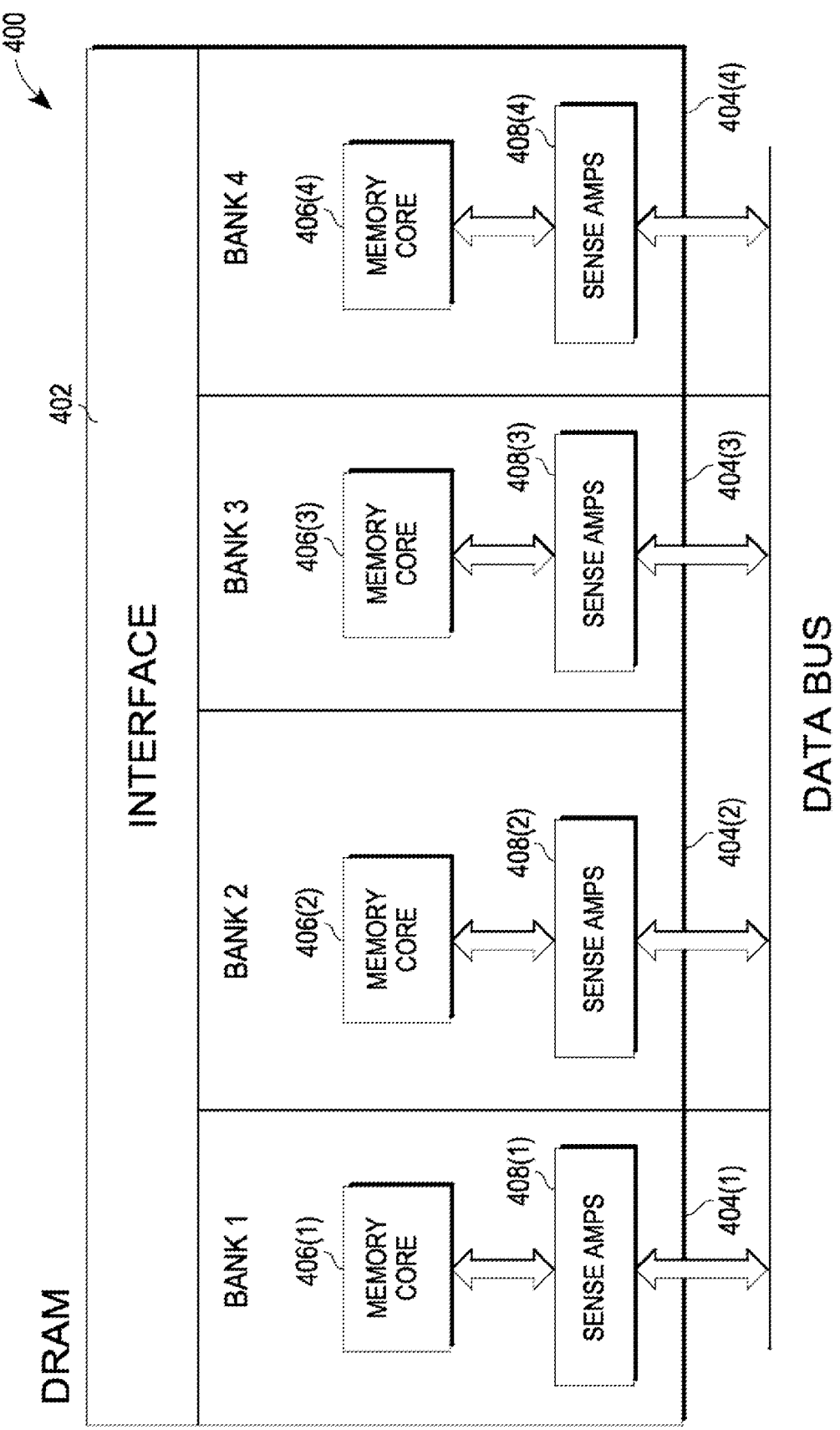
FIG. 4 is a block diagram of a sample multi-bank DRAM.

To facilitate a complete understanding of the invention, a comparison will now be made between the timing diagram of FIG. 10 and the timing diagram of FIG. 5, which shows the operation of the prior art multi-bank DRAM of FIG. 4. Several points should be noted with regard to the timing diagram of FIG. 5. First, note that in FIG. 5, the DRAM 402 requires more time to receive a complete access request than it does to place one granularity of data 506 onto the data bus 410. More specifically, to receive a complete access request, the DRAM 402 has to: (1) receive a RAS signal and a row address; and then (2) receive a CAS signal and a column address. In that same amount of time, two base granularities of data can be accessed and placed onto the data bus 410 (i.e. the DRAM 402 can be cycled twice), as shown. Because the DRAM 402 takes longer to receive a complete request than it does to cycle the memory once, the DRAM 402 cannot keep the data bus 410 full unless it accesses several base granularities of data in response to each access request (i.e. implements burst mode). Unfortunately, by implementing burst mode, the DRAM 402 increases its output data granularity. As discussed previously, this has undesirable consequences.

The memory 802 of FIG. 9 has no such problem. Because the controller 804 is able to send, and the interface 810 of memory 802 is able to receive, both a row command and a column command (even though they may correspond to different access requests) in the time it takes to cycle the memory 802 once, memory 802 is not required to implement burst mode. Hence, memory 802 is able to achieve full data bus utilization without increasing data granularity, as shown in FIG. 10.

Figure 5:
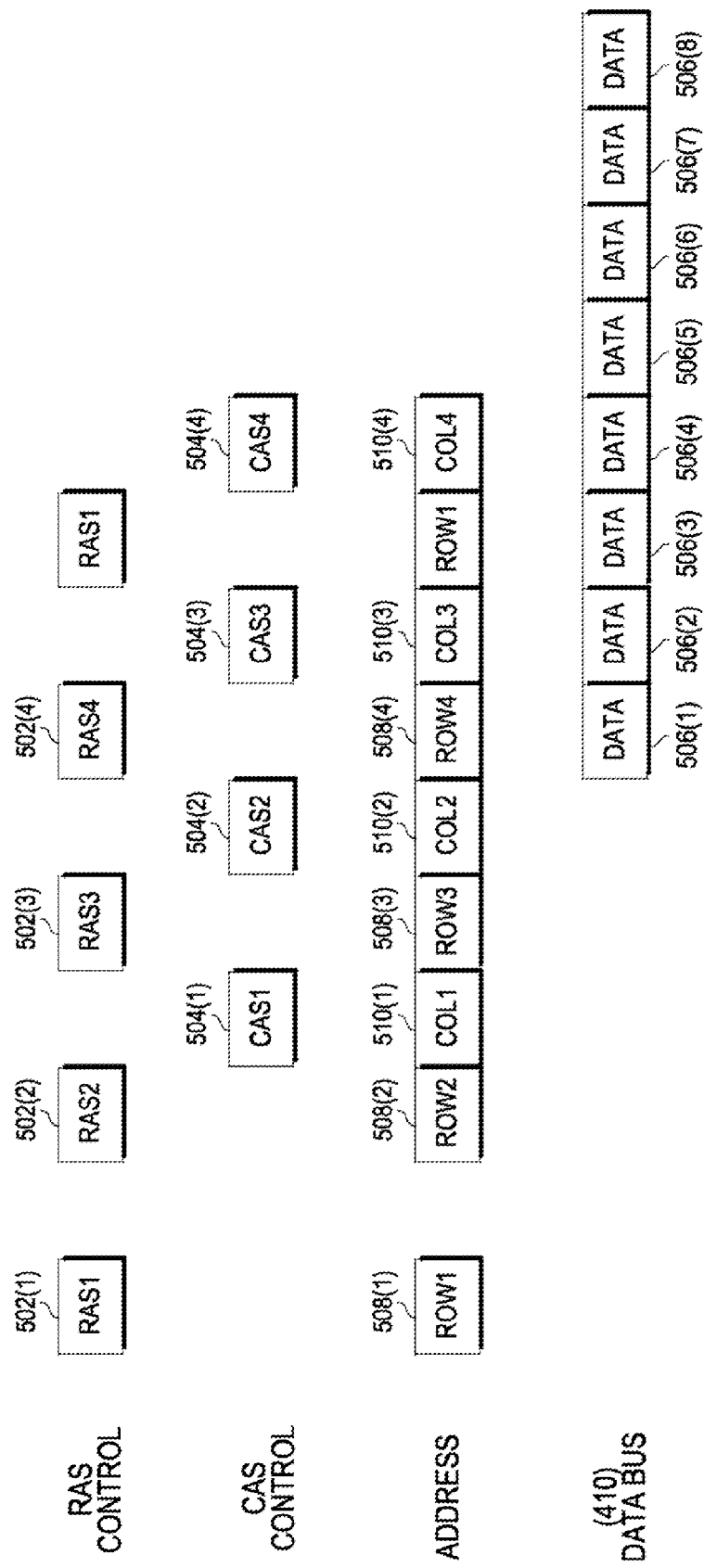
FIG. 5 is a timing diagram illustrating the operation of the DRAM of FIG. 4 during several read cycles.
Figure 6:
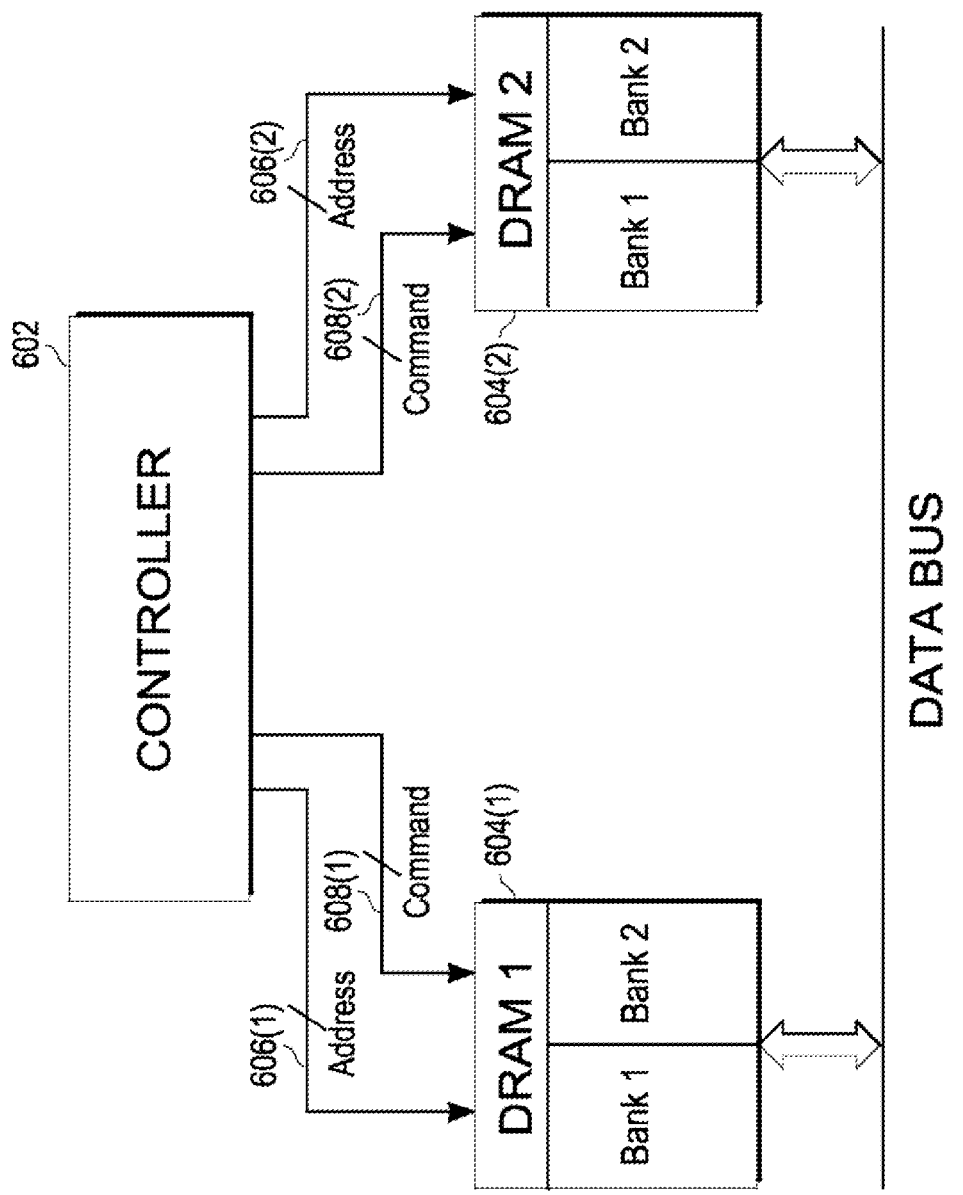
FIG. 6 is a block diagram of a multiple DRAM implementation.
Figure 7:
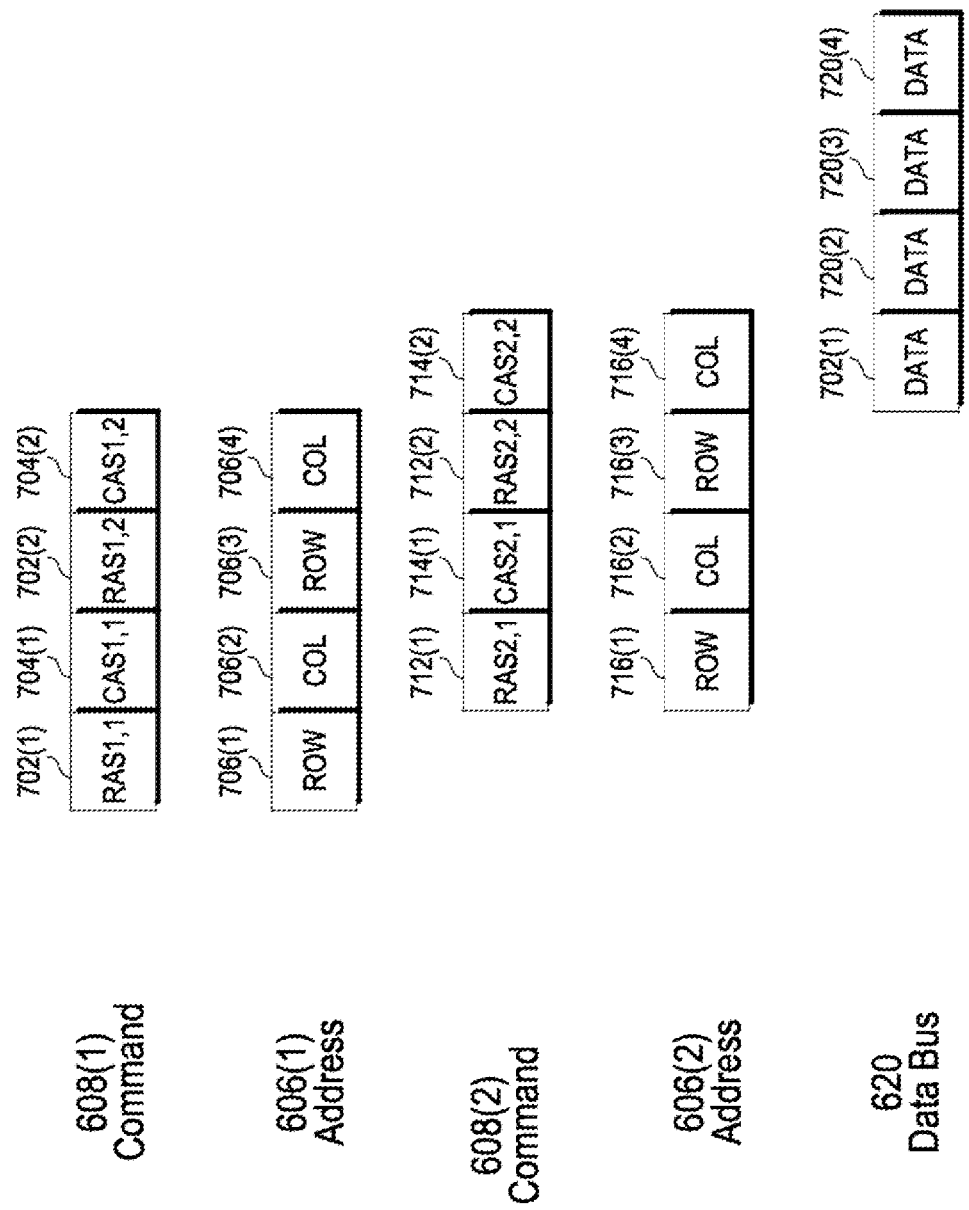
FIG. 7 is a timing diagram illustrating the operation of the implementation shown in FIG. 6 during several read cycles.

Another point to note with regard to FIG. 5 is that DRAM 402 has a time constraint, commonly referred to as Trr, which precludes it from receiving one RAS signal (i.e. a row command) immediately after another. More particularly, the DRAM 402 is required to wait at least a Trr period of time between successive RAS signals, even if the RAS signals are directed to different banks. This time constraint is due, at least in part, to the fact that the banks 404(1), 404(2) of DRAM 402 are not electrically isolated from each other.

To elaborate, when a row of memory cells is accessed in response to a row command, one of the sets of sense amps 408 is activated. The activation of one of the sets of sense amps 408 causes a current spike, which in turn causes electrical noise. In a typical multi-bank DRAM 402, there is no electrical isolation between the various banks 404; hence, the noise generated in one set of sense amps 408 is felt in the other. To prevent the noise from one set of sense amps 408 from corrupting the data in the other set of sense amps 408, it is typically necessary to wait a Trr period of time between successive sense amp activations. Because of this time constraint, there is a minimum required time delay of Trr between successive row commands. This is so even if the row commands are directed to different banks 404 of the DRAM 402. As a result of this time constraint, the time period between successive row commands is lengthened. With this lengthened time period, it is very difficult if not impossible for the DRAM 402 to receive a complete access request in the time it takes to cycle the DRAM 402 once. As a result, DRAM 402 is unable to achieve full data bus utilization without implementing burst mode.

Again, the memory 902 of FIG. 9 has no such problem. Because the memory portions 812(1), 812(2) are electrically isolated from each other, noise from one portion 812 does not affect the other. As a result, there is no required minimum time delay between successive sense amp activations in the different portions 812, which in turn means that there is no required minimum time delay between successive interleaved row commands. As shown in FIG. 10, interleaved row commands 1004 may be received and passed on to the different memory portions 812 in immediate succession, if so desired. By eliminating the Trr time constraint, memory 802 makes it possible to time the access requests such that data sets 1008 are placed onto the data bus 820 in immediate succession with substantially no intervening idle time. By eliminating data bus idle time, full data bus utilization is achieved. As noted previously, this is accomplished without increasing data granularity and without implementing multiple separate memories. Hence, memory 802 represents a significant improvement over the prior art.

Thus far, the operation of the system 800 has been described only with reference to read operations. It should be noted, though, that the same concepts, timing, sequence of commands, and data ordering may be applied to write operations. The main difference is that instead of the memory 802 sending data onto the data bus 820 to the controller 804, the controller 804 is sending data onto the data bus 820 to the memory 802. More specifically, in a read operation, the memory 802: (1) accesses a row of data from one of the memory portions 812; (2) loads that data into one of the sets of sense amps 908; and (3) outputs a portion of the data in the sense amps 908 onto the data bus 820. In a write operation, the memory 802: (1) accesses a row of data from one of the memory portions 812; (2) loads that data into one of the sets of sense amps 908; (3) obtains a set of write data from the data bus 820; (4) loads the write data into a portion of one of the sets of sense amps 908; and (4) stores the data in the sense amps 908 back into the appropriate row. As this discussion shows, the difference between a read and a write operation resides mainly in the direction of the flow of data. With regard to the timing of the portion control signals, the row and column commands, and even the data sets on the data bus, all may remain the same as that shown in FIG. 10 for read operations. In a write operation, it will be up to the controller 804 to send the data onto the data bus 820 at the proper time.

Figure 11:
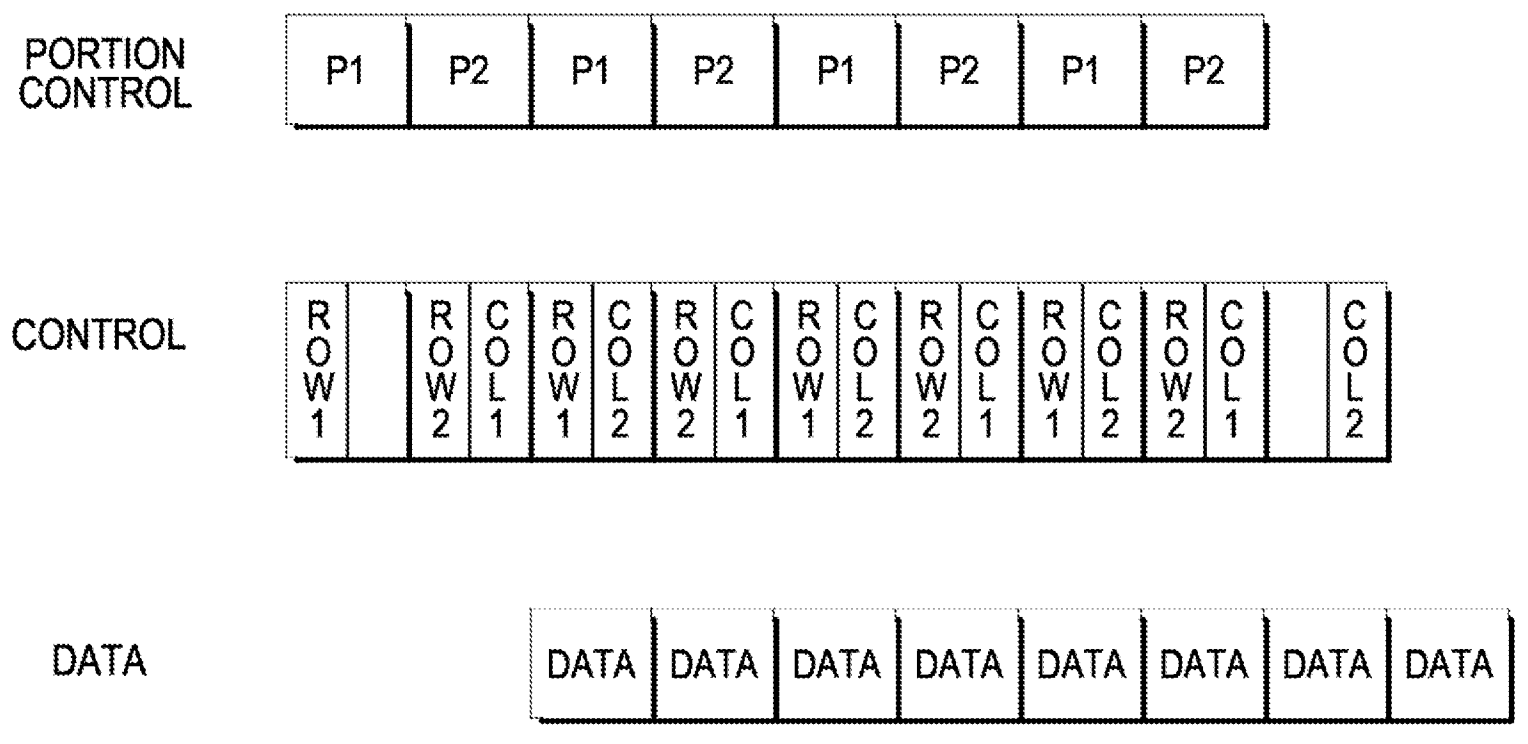

Thus far, memory 802 has been described as having separate row control 920 and column control 922 ports/lines, and as receiving row and column commands concurrently on those ports/lines. While this is one possible embodiment, it should be noted that other embodiments are also possible. For example, if so desired, one set of control lines may be multiplexed to carry both the row command and the column command, as shown in the timing diagram of FIG. 11. This may be carried out, for example, by running the single set of control lines at double speed, or by sending a row command and a column command on different halves of a clock cycle. So long as a row command and a column command can be received in the time it takes to cycle the memory 802 once, any method/configuration for supplying the row command and column command may be used/implemented.

As note previously, in one embodiment, it is the memory controller 804 (FIG. 8) that controls the accessing of data from the memory 802. In particular, it is the controller 804 that controls the sending of access requests to the memory 802, and the interleaving of access requests to the different portions 812 of the memory 802 (as shown in FIG. 10). In carrying out this function, the controller 804 has the ability to send a row command and a column command to the memory 802 in an amount of time X, where X is less than or equal to the amount of time T that it takes to cycle the memory once, and has the logic for properly controlling the timing of the access requests.

In controlling the timing of the access requests, the controller 804 in one embodiment implements the following rule. If two consecutive access requests are directed to different portions 812 of the memory 802, then the access requests may be timed such that they cause the data bus 820 to be fully utilized (i.e. no data bus idle time between successive data sets, as shown in FIG. 10). Because the access requests are directed to different portions 812 of the memory 802, there is no required minimum time delay between the access requests (i.e. between the row commands of the access requests).

Figure 12:
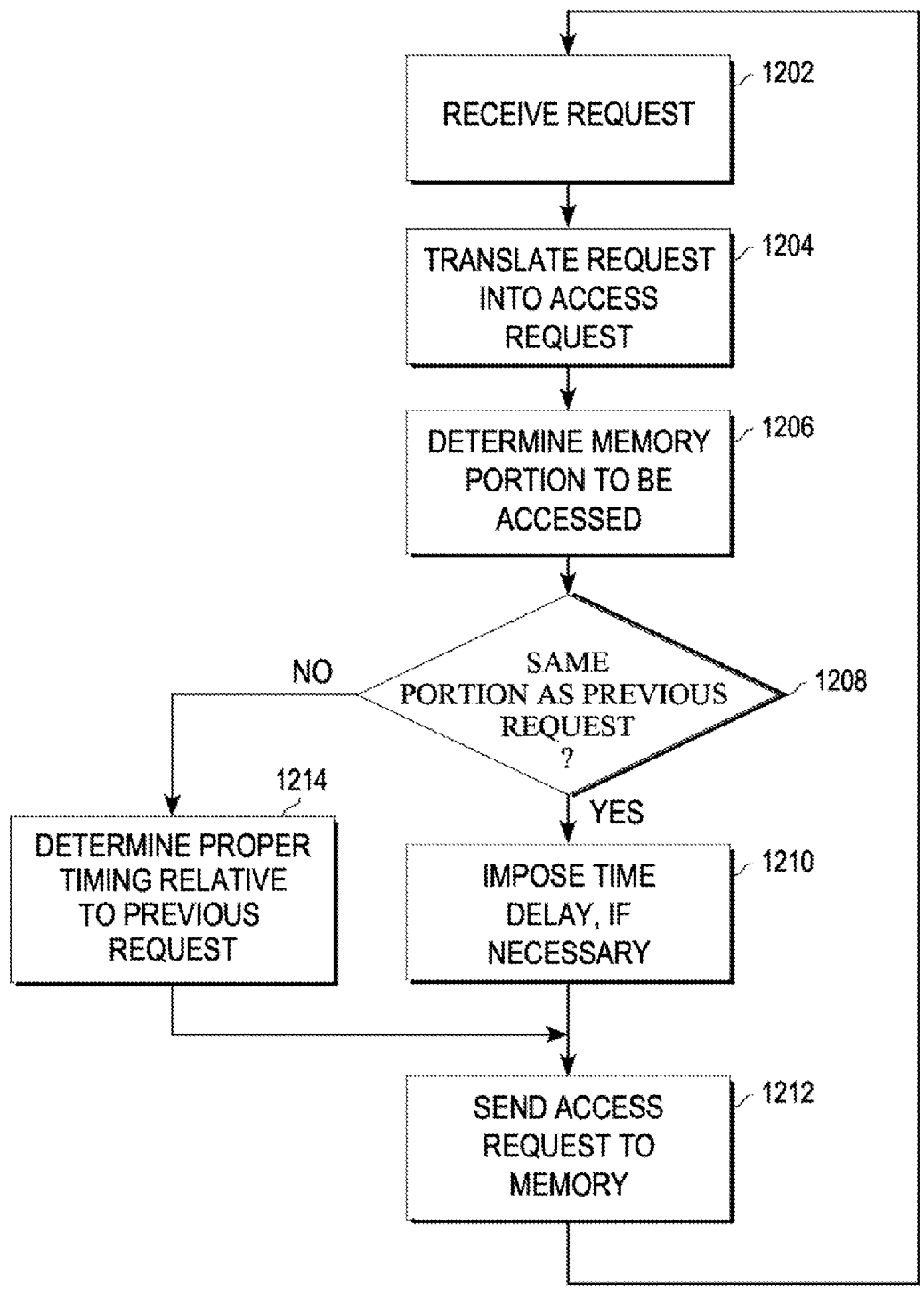
FIG. 12 is a flow diagram illustrating the operation of the memory controller of FIG. 8 in accordance with one embodiment of the present invention.

On the other hand, if two consecutive requests are directed to the same memory portion 812, then the controller 804 imposes a delay between the row commands of the access requests, if necessary. This delay may, for example, be equal to Trr. Because the access requests will cause the same set of sense amps to be activated, this delay is implemented to prevent data errors. The operation of the controller 804 is shown in the flow diagram of FIG. 12.

In operation, the controller 804 receives (1202) a request from the external component 806 to access the memory 802. In response, the controller 804 translates (1204) the request to derive an access request that the memory 802 can understand. In one embodiment, based upon the request, the controller 804 generates a set of portion control information, a row command, and a column command. Based upon the access request, the controller 804 determines (1206) the memory portion 812 that needs to be accessed to service this request. If this portion 812 is determined (1208) by the controller to be the same portion as that accessed by the access request immediately preceding the current access request, then the controller 804 imposes (1210) a time delay, if necessary. More specifically, the controller 804 determines whether a certain amount of time, such as Trr, has passed since the row command of the previous access request was sent to the memory 802. If not, then a delay is imposed to ensure that the proper amount of time has passed before sending the row command of the current access request to the memory 802. Once the proper amount of time has passed, the controller 804 sends (1212) the current access request (comprising a row command and a subsequent column command) to the memory 802. The controller 804 loops back to receive (1202) another request from the external component 806.

Returning to (1208), if the controller 804 determines that the current access request is not directed to the same memory portion 812 as the immediately preceding access request, then it proceeds to determine (1214) the proper timing for sending the current access request relative to the previous access request. In doing so, the controller 804 (when possible) times the sending of the current access request such that it causes the memory 802 to output data onto the data bus 820 (in the case of a read operation) with substantially no idle time between data sets. By doing so, the controller 804 enables the memory 802 to achieve full data bus utilization. In some cases, it may not be possible for the controller 804 to time the requests such that full data bus utilization is achieved. For example, when there is a large time interval between requests from the external component 806, it may not be possible for the controller 804 to send access requests which are close enough in time to achieve full data bus utilization. In such cases, the controller 804 sends the current access request immediately to the memory 802 to minimize idle time on the data bus.

A point to note is that since the current access request is directed to a different memory portion than the immediately preceding access request, the controller 804 does not need to impose any minimum time delay between the sending of the access requests. Thus, if so desired, the row command of the current access request may be sent immediately after the row command of the preceding access request. In an SDRAM, the row command of the preceding access request and the row command of the current access request may be sent in consecutive clock cycles. Once the proper timing is determined, the controller 804 sends (1212) the current access request to the memory 802 at the proper time to cause the memory 802 to be accessed. The controller 804 loops back to receive (1202) another request from the external component 806. In the manner described, the controller 804 interleaves access requests between the memory portions 812 whenever possible to enable full data bus utilization. At the same time, it imposes time delays when necessary to prevent data errors.

At this point, it should be noted that although the invention has been described with reference to a specific embodiment, it should not be construed to be so limited. Various modifications may be made by those of ordinary skill in the art with the benefit of this disclosure without departing from the spirit of the invention. Thus, the invention should not be limited by the specific embodiments used to illustrate it but only by the scope of the appended claims.

What is claimed is:

1. A memory controller to control a memory device having first and second storage arrays, the memory controller comprising:
   circuitry to receive commands for execution by the memory device;
   circuitry to selectively delay each of the commands; and
   circuitry to transmit each of the selectively-delayed commands to the memory device as a sequence of the commands;
   wherein the circuitry to selectively delay each of the commands is
      to delay each given command if the given command and any prior command in the sequence separated from the given command by less than a predetermined time interval are directed to a same one of the first and second storage arrays, and
      to not delay the given command if
         (a) the given command and
         (b) all prior commands in the sequence separated from the given command by less than the predetermined time interval,
         are such that (a) and (b) are directed to different ones of the first and second storage arrays; and
   wherein the selectively-delayed commands comprise distinct row access commands and column access commands, and wherein the memory controller can transmit a row access command directed to the first storage array contemporaneous with transmission of a column access command directed to the second storage array, and can transmit a column access command directed to the first storage array contemporaneous with transmission of a row access command directed to the second storage array.

2. The memory controller of claim 1, adapted for use where the first and second storage arrays of the memory device are electrically isolated from each other, wherein the memory controller can transmit consecutive first and second commands in the sequence to the memory device, via a common memory interface, in a manner unseparated by any bus idle time, provided that the second command in the sequence does not follow a prior command directed to the common one of the first and second storage arrays by less than the predetermined time interval.

3. The memory controller of claim 1, adapted for use where the first and second storage arrays of the memory device are electrically isolated from each other, wherein the memory controller can transmit consecutive first and second commands in the sequence to the memory device, via a common memory interface, in a manner unseparated by any minimum time period, provided that the second command in the sequence does not follow a prior command directed to the common one of the first and second storage arrays by less than the predetermined time interval.

4. The memory controller of claim 1, wherein the circuitry to transmit each of the selectively-delayed commands to the memory device is to serially transmit each of the selectively-delayed commands to the memory device.

5. The memory controller of claim 1, wherein the circuitry to transmit each of the selectively-delayed commands to the memory device is to transmit each of the selectively-delayed commands to the memory device in the form of one or more packets.

6. The memory controller of claim 1, wherein the circuitry to transmit each of the selectively-delayed commands to the memory device is to transmit each of the selectively-delayed commands to the memory device in the form of parallel data and wherein the circuitry to transmit each of the selectively-delayed commands to the memory device can transmit first and second commands to respective ones of the first and second storage arrays using consecutive memory controller transmit clock cycles.

7. The memory controller of claim 6, wherein the memory controller is a dynamic random access memory (DRAM) controller.

8. The memory controller of claim 1, wherein the circuitry to transmit each of the selectively-delayed commands to the memory device is to transmit each command with an indicator that identifies whether the command is directed to the first storage array or the second storage array.

9. A memory controller to control a memory device having first and second portions, each portion comprising at least one bank, the memory controller comprising:
   circuitry to receive of a sequence of commands for execution by the memory device;
   circuitry to selectively delay each of the commands; and
   circuitry to transmit each of the selectively-delayed commands to the memory device;
   wherein the circuitry to selectively delay each of the commands is
     to delay each given command if the given command and any prior command in the sequence are directed to one or more banks in a same one of the first and second portions, in a manner separated by less than a predetermined time interval, and
     to not delay the given command if
       (a) the given command and
       (b) all prior commands in the sequence separated from the given command by less than the predetermined time interval,
       are such that (a) and (b) are directed to banks in different ones of the first and second portions;
   wherein the memory controller can transmit a row access command directed to a bank in the first portion contemporaneous with transmission of a column access command directed to a bank in the second portion, and can transmit a column access command directed to a bank in the first portion contemporaneous with transmission of a row access command directed to a bank the second portion.

10. The memory controller of claim 9, adapted for use where the first and second portions of the memory device are electrically isolated from each other, wherein the memory controller can transmit consecutive first and second commands in the sequence to the memory device, via a common memory interface, in a manner unseparated by any bus idle time, provided that the second command in the sequence does not follow a prior command directed to a bank in the common one of the first and second portions by less than the predetermined time interval.

11. The memory controller of claim 9, adapted for use where the first and second portions of the memory device are electrically isolated from each other, wherein the memory controller is adapted to transmit consecutive first and second commands in the sequence to the memory device, via a common memory interface, in a manner unseparated by any minimum time period, provided that the second command in the sequence does not follow a prior command directed to a bank in the common one of the first and second portions by less than the predetermined time interval.

12. The memory controller of claim 9, wherein the circuitry to transmit each of the selectively-delayed commands to the memory device is to serially transmit each of the selectively-delayed commands to the memory device, in the form of one or more serial packets.

13. The memory controller of claim 9, wherein the circuitry to transmit each of the selectively-delayed commands to the memory device is to transmit each of the selectively-delayed commands to the memory device in the form of parallel data.

14. The memory controller of claim 9, wherein the circuitry to transmit each of the selectively-delayed commands to the memory device can transmit first and second commands to respective ones of the first and second portions using consecutive memory controller transmit clock cycles.

15. The memory controller of claim 9, wherein the memory controller is a dynamic random access memory (DRAM) controller, and wherein the selectively-delayed commands comprise distinct row access commands and column access commands.

16. A memory controller to control a dynamic random access memory ("DRAM") device having first and second portions, each portion comprising at least one bank, the memory controller comprising:
   circuitry to receive of a sequence of commands for execution by the DRAM device;
   circuitry to selectively delay each of the commands; and
   circuitry to transmit each of the selectively-delayed commands to the DRAM device;
   wherein the circuitry to selectively delay each of the commands is
     to delay each given command if the given command and any prior command in the sequence are directed to one or more banks in a same one of the first and second portions, in a manner separated by less than a predetermined time interval, and
     to not delay the given command if
       (a) the given command and
       (b) all prior commands in the sequence separated from the given command by less than the predetermined time interval,
       are such that (a) and (b) are directed to banks in different ones of the first and second portions, such that the given command can follow an immediately prior command the sequence in consecutive transmission clock cycles;
   wherein the memory controller can transmit a row access command directed to a bank in the first portion contemporaneous with transmission of a column access command directed to a bank in the second portion, and can transmit a column access command directed to a bank in the first portion contemporaneous with transmission of a row access command directed to a bank the second portion.

17. The memory controller of claim 16, wherein the DRAM device is characterized by a time constraint within which the DRAM device cannot receive two consecutive row commands directed to one or more banks associated with a given one of the first and second portions, and wherein the circuitry to selective delay each command can transmit first and second commands consecutively in a manner separated by less than the time constraint provided that the first and second commands are each directed to a bank in a respective one of the first and second portions.

18. The memory controller of claim 16, wherein the circuitry to transmit each of the selectively-delayed commands to the memory device is to serially transmit each of the selectively-delayed commands to the memory device, in the form of one or more serial packets.

19. The memory controller of claim 16, wherein the selectively-delayed commands comprise distinct row access commands and column access commands, and wherein each command includes a field that indicates whether the command is to be directed to a bank in the first portion or a bank in the second portion.

* * * * *